(12) United States Patent
Inoue et al.

(10) Patent No.: US 12,166,136 B2
(45) Date of Patent: Dec. 10, 2024

(54) SEMICONDUCTOR DEVICE AND METHOD OF MANUFACTURING THE SAME

(71) Applicant: Renesas Electronics Corporation, Tokyo (JP)

(72) Inventors: Zen Inoue, Tokyo (JP); Yudai Higa, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 18/541,441

(22) Filed: Dec. 15, 2023

(65) Prior Publication Data
US 2024/0313128 A1   Sep. 19, 2024

(30) Foreign Application Priority Data

Mar. 15, 2023   (JP) .................................. 2023-041066

(51) Int. Cl.
  *H01L 29/866* (2006.01)
  *H01L 27/02* (2006.01)
  *H01L 29/66* (2006.01)

(52) U.S. Cl.
  CPC ........ *H01L 29/866* (2013.01); *H01L 27/0255* (2013.01); *H01L 29/66106* (2013.01)

(58) Field of Classification Search
  None
  See application file for complete search history.

(56) References Cited

U.S. PATENT DOCUMENTS

| | | | | |
|---|---|---|---|---|
| 4,319,257 A | * | 3/1982 | Beasom | H01L 29/7302 257/E29.175 |
| 2006/0208340 A1 | * | 9/2006 | Glenn | H01L 24/05 257/E29.016 |
| 2007/0096261 A1 | * | 5/2007 | Otake | H01L 29/66106 257/603 |
| 2011/0127577 A1 | * | 6/2011 | Bobde | H01L 29/7811 257/173 |
| 2013/0146941 A1 | * | 6/2013 | Andou | H01L 29/866 257/140 |

FOREIGN PATENT DOCUMENTS

JP    2013-183039 A    9/2013

* cited by examiner

*Primary Examiner* — Khaja Ahmad
(74) *Attorney, Agent, or Firm* — Rimon P.C.

(57) ABSTRACT

A semiconductor device includes a first well region, a second well region, a body region, and a cathode region. The impurity concentration of the body region is higher than the impurity concentration of the first well region, and the impurity concentration of the second well region is higher than the impurity concentration of the body region. In plan view, the body region includes the cathode region, and the cathode region includes the second well region. The cathode region configures a cathode of a Zener diode, and the first well region, the second well region, and the body region configure an anode of the Zener diode.

8 Claims, 20 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2023-041066 filed on Mar. 15, 2023, including the specification, drawings and abstract is incorporated herein by reference in its entirety.

BACKGROUND

The present disclosure relates to a semiconductor device and method of manufacturing the same, and more particularly, to a semiconductor device including a Zener diode and method of manufacturing the same.

A semiconductor device has built-in protective circuit to protect a MISFET (Metal Insulator Semiconductor Field Effect Transistor).

There is a disclosed technique listed below.
[Patent Document 1] Japanese Unexamined Patent Application Publication No. 2013-183039

For example, Patent Document 1 discloses a semiconductor device with MISFET and protective circuit. As a semiconductor element configuring the protective circuit, a Zener diode is disclosed.

SUMMARY

When a Zener diode is used as the protective circuit, it is important to stabilize the breakdown voltage of the Zener diode. However, depending on the structure of the Zener diode, when the breakdown operation is repeated, the breakdown voltage of the Zener diode fluctuates. If the breakdown voltage of the Zener diode fluctuates greatly, the breakdown voltage required for the protective circuit may not be maintained. Therefore, it is desired to improve the reliability of the semiconductor device by suppressing the fluctuation in the breakdown voltage of the Zener diode.

Other objects and novel features will become apparent from the description of this specification and the accompanying drawings.

The typical ones of the embodiments disclosed in the present application will be briefly described as follows.

According to one embodiment, a semiconductor device includes a first impurity region of a first conductivity type formed in a semiconductor substrate, a second impurity region of the first conductivity type formed in the first impurity region, a third impurity region of the first conductivity type formed in the first impurity region, and a fourth impurity region of a second conductivity type opposite the first conductivity type formed in the third impurity region. An impurity concentration of the third impurity region is higher than an impurity concentration of the first impurity region, and an impurity concentration of the second impurity region is higher than an impurity concentration of the third impurity region. In plan view, the third impurity region includes the fourth impurity region, and in plan view, the fourth impurity region includes the second impurity region. The fourth impurity region configures a cathode of the Zener diode, and the first impurity region, the second impurity region, and the third impurity region configure an anode of the Zener diode.

According to one embodiment, a manufacturing method of a semiconductor substrate is a manufacturing method of the semiconductor device having a first region where a Zener diode is formed. The manufacturing method of the semiconductor device includes (a) forming a first impurity region of a first conductivity type in a semiconductor substrate in the first region, (b) after the (a), forming a second impurity region of the first conductivity type in the first impurity region, (c) after the (b), forming a third impurity region of the first conductivity type in the first impurity region, (d) after the (c), forming a fourth impurity region of a second conductivity type opposite the first conductivity type in the third impurity region. An impurity concentration of the third impurity region is higher than an impurity concentration of the first impurity region, and an impurity concentration of the second impurity region is higher than an impurity concentration of the third impurity region. In plan view, the third impurity region includes the fourth impurity region, and in plan view, the fourth impurity region includes the second impurity region. The fourth impurity region configures a cathode of the Zener diode, and the first impurity region, the second impurity region, and the third impurity region configure an anode of the Zener diode.

According to one embodiment, the reliability of semiconductor device can be improved.

DETAILED DESCRIPTION

Figure 1:
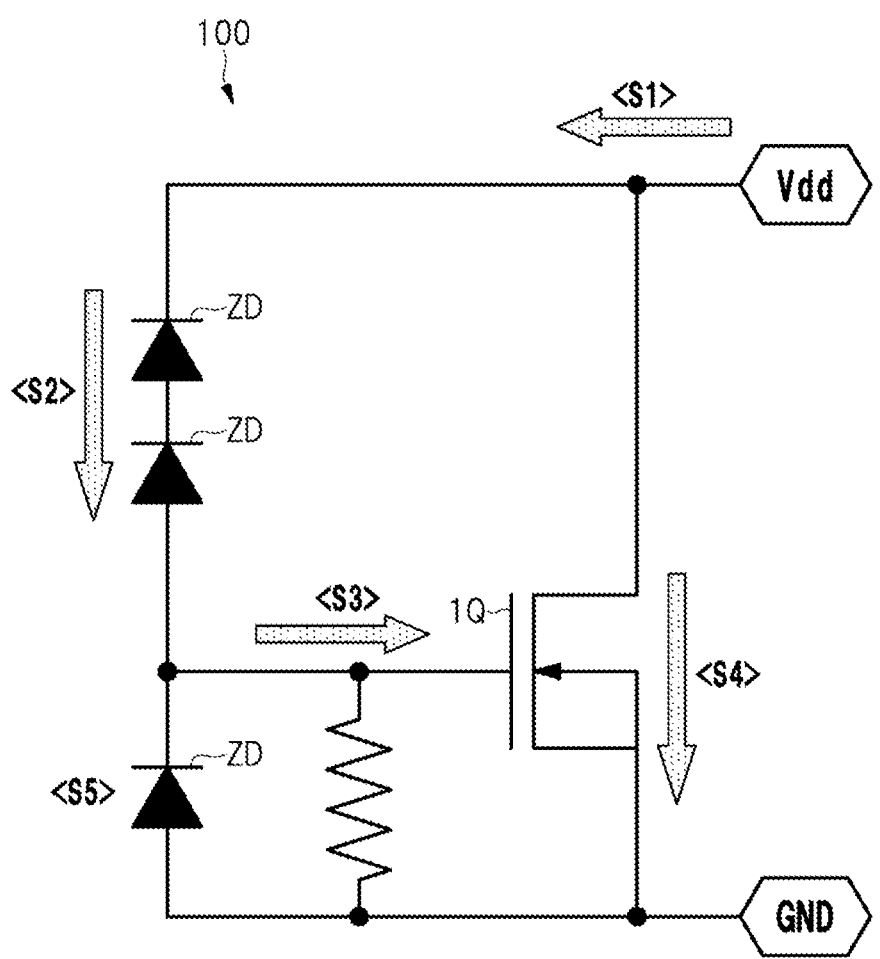
FIG. 1 is an equivalent circuit diagram showing a protective circuit in a first embodiment.

Hereinafter, embodiments will be described in detail based on the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

First Embodiment

Structure of Semiconductor Device

The semiconductor device (semiconductor chip) in the first embodiment will be described below with reference to FIGS. 1 to 4. FIG. 1 shows the protective circuit 100 included in the semiconductor device. The protective circuit 100 is used as an ESD protective circuit.

As shown in FIG. 1, the protective circuit 100 includes a plurality of Zener diodes ZD and the high withstand voltage MISFET 1Q. The Zener diode ZD provided between the power supply potential pad (Vdd) and the gate electrode of the high withstand voltage MISFET 1Q configures a trigger unit. The Zener diode ZD provided between the ground potential pad (GND) and the gate electrode of the high withstand voltage MISFET 1Q configures a gate protector.

The withstand voltage of the Zener diode ZD of the trigger unit is higher than a maximum rated voltage of the semiconductor device. When the breakdown voltage of the Zener diode ZD is greater than the product breakdown voltage, the protective circuit 100 is broken prior to the operation of the protective circuit 100. Therefore, the breakdown voltage of the Zener diode ZD of the trigger unit is higher than the maximum rated voltage of the semiconductor device and lower than the product breakdown voltage. The Zener diode ZD of the gate protector is provided mainly to fix the gate voltage of the high withstand voltage MISFET 1Q.

The high withstand voltage MISFET 1Q has a characteristic that the on-state breakdown voltage varies depending on the gate voltage. If the Zener diode ZD can be fixed at a lower withstand voltage, the breakdown timing of the high withstand voltage MISFET 1Q can be controlled. Therefore, if the type of breakdown voltage of the Zener diode ZD increases, the protective circuit 100 having various breakdown voltages can be used as the protective circuit.

The operation principle of the protective circuit 100 will be described. First, when a surge voltage exceeding the withstand voltage of the Zener diode ZD of the trigger unit is applied from the power supply potential pad (Vdd) as in the step S1, a current flows through the Zener diode ZD of the trigger unit as in the step S2, and a gate potential is generated at the gate electrode of the high withstand voltage MISFET 1Q as in the step S3. Then, the high withstand voltage MISFET 1Q is set to on-state, the surge current flows toward the ground potential pad (GND) as in the step S4, and the surge voltage is clamped by the Zener diode ZD of the gate protector as in step S5.

Structure of Zener Diode ZD

The Zener diode ZD in the first embodiment will be described below with reference to FIGS. 2 to 4.

Figure 2:
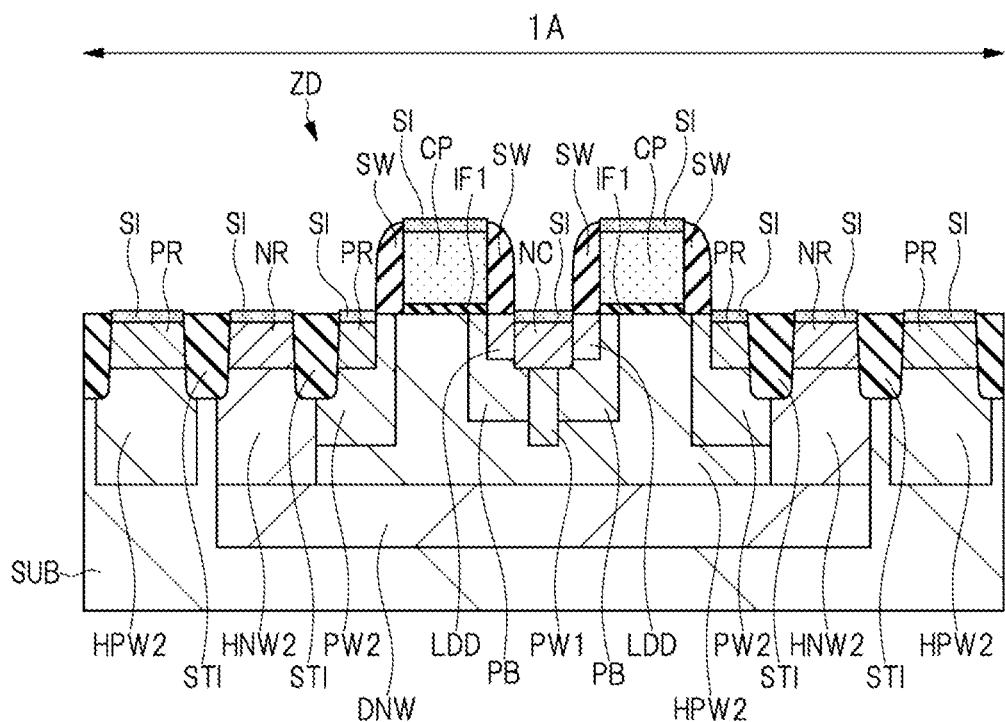
FIG. 2 is a cross-sectional view showing the semiconductor device in the first embodiment.
Figure 2:
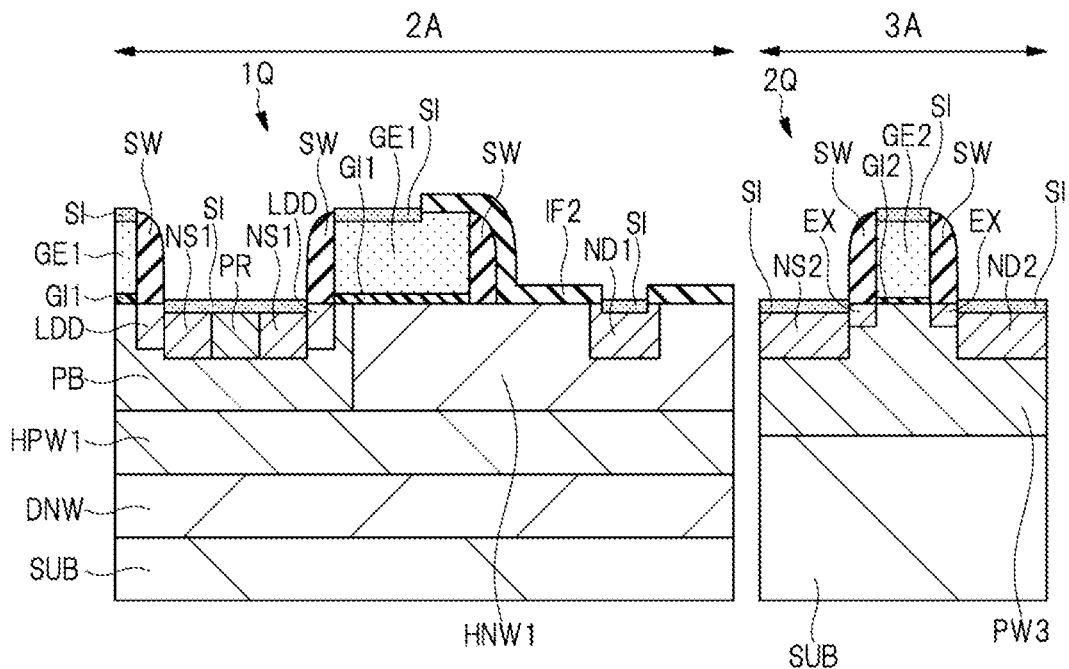

As shown in FIG. 2, the semiconductor device includes the region 1A where the Zener diode ZD is formed, the region 2A in where the n-type high withstand voltage MISFET 1Q is formed, and the region 3A where the n-type low withstand voltage MISFET 2Q is formed. Note that the semiconductor device also includes the p-type high withstand voltage MISFET and the p-type low withstand voltage MISFET, but the explanation thereof is omitted here.

The Zener diode ZD is formed in the semiconductor substrate SUB in the region 1A. The semiconductor substrate SUB is, for example, a silicon substrate in which p-type impurities are implanted. The element isolation portion STI is formed in the semiconductor substrate SUB. The element isolation portion STI includes a trench formed in the semiconductor substrate SUB and a silicon oxide film embedded in the trench.

In the semiconductor substrate SUB, the n-type well region DNW and the n-type well region HNW2 are formed. The well region HNW2 is formed so as to reach the well region DNW from an upper surface of the semiconductor substrate SUB. The well region DNW and the well region HNW2 are formed so as to surround the Zener diode ZD. The well region DNW and the well region HNW2 electrically isolate the Zener diode ZD from the semiconductor substrate SUB and electrically isolate the Zener diode ZD from the high withstand voltage MISFET 1Q in the region 2A and the low withstand voltage MISFET 2Q in the region 3A. In the well region HNW2, the n-type high concentration diffusion region NR is formed. The high concentration diffusion region NR is formed at the upper surface of the semiconductor substrate SUB in the well region HNW2. The impurity concentration of the high concentration diffusion region NR is higher than the impurity concentration of the well region HNW2.

The p-type well region HPW2 is formed in the semiconductor substrate SUB in the region 1A surrounded by the well region DNW and the well region HNW2. The well region HPW2 is formed so as to be surrounded by the well region HNW2, and a bottom surface of the well region HPW2 is covered with the well region DNW. In the well region HPW2, the p-type body region PB and the p-type well regions PW1, PW2 are formed. The impurity concentration of the body region PB is higher than the impurity concentration of the well region HPW2. The impurity concentration of the well regions PW1, PW2 is higher than the impurity concentration of the body region PB. The well regions PW1, PW2 are formed deeper than the body region PB. That is, the bottom surfaces of the well regions PW1, PW2 are located deeper than the bottom surface of the body region PB.

In the body region PB, the n-type low concentration diffusion region LDD and the n-type cathode region NC are formed. The low concentration diffusion region LDD and the cathode region NC are formed at the upper surface of the semiconductor substrate SUB in the body region PB. The impurity concentration of the low concentration diffusion region LDD is lower than the impurity concentration of the cathode region NC.

The dielectric film IF1 is formed on the well region HPW2. The conductive pattern CP is formed on the dielectric film IF1. The conductive pattern CP and the dielectric film IF1 are formed on the semiconductor substrate SUB between the cathode region NC and the high concentration diffusion region PR described later. The dielectric film IF1 is, for example, a silicon oxide film. The thickness of the dielectric film IF1 is, for example, 5 nm or more and 15 nm or less. The conductive pattern CP is a polycrystalline silicon film in which n-type impurities are implanted.

Figure 3:
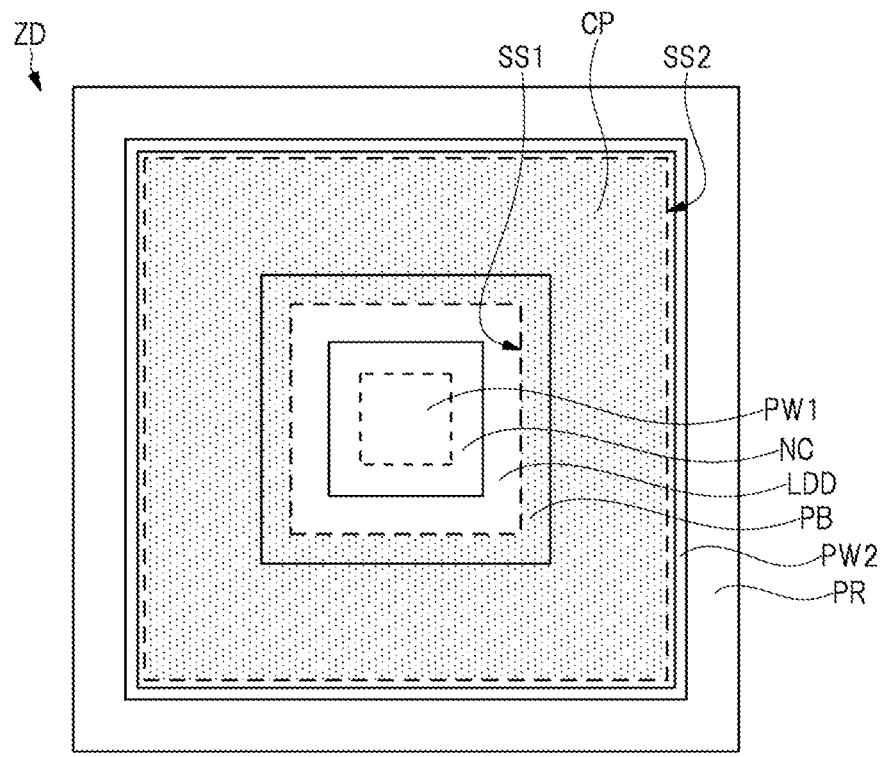
FIG. 3 is a main portion plan view showing the semiconductor device in the first embodiment.

FIG. 3 is a plan view of the Zener diode ZD. As shown in FIG. 3, in plan view, the cathode region NC includes the well region PW1, the low concentration diffusion region LDD includes the cathode region NC, and the body region PB includes the low concentration diffusion region LDD. That is, in plan view, the cathode region NC is formed so as to overlap the well region PW1, the low concentration diffusion region LDD is formed so as to surround the cathode region NC, and the body region PB is formed so as to surround the low concentration diffusion region LDD, the cathode region NC, and the well region PW1.

Figure 11:
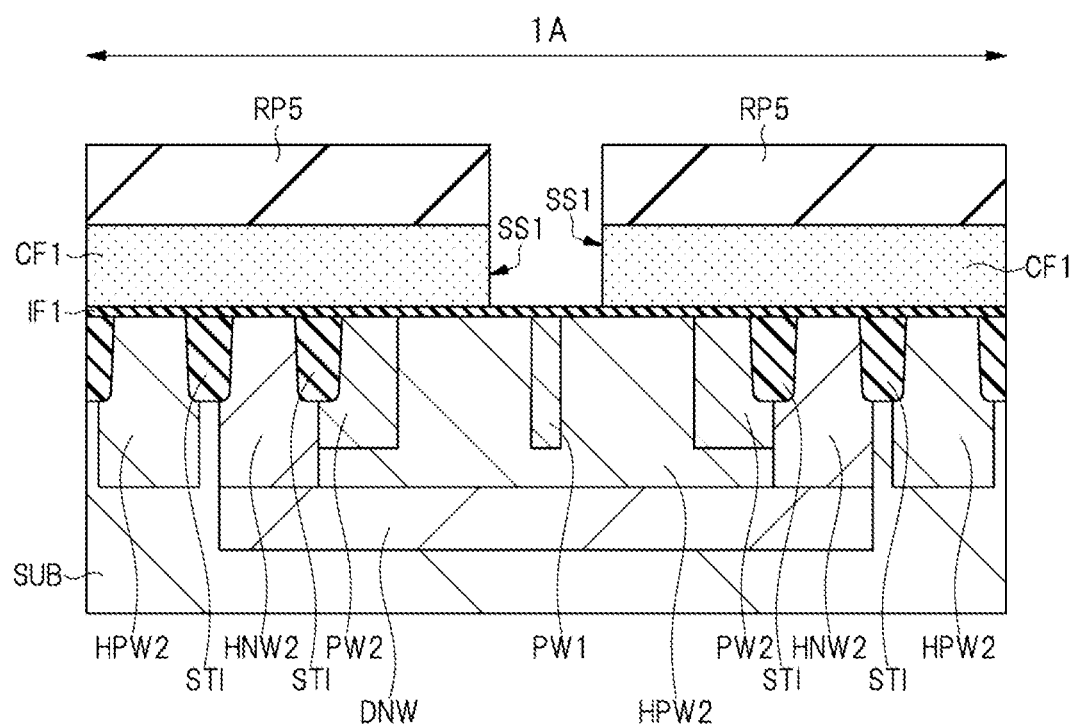
FIG. 11 is a cross-sectional view showing a manufacturing step of the semiconductor device following FIG. 10.
Figure 11:
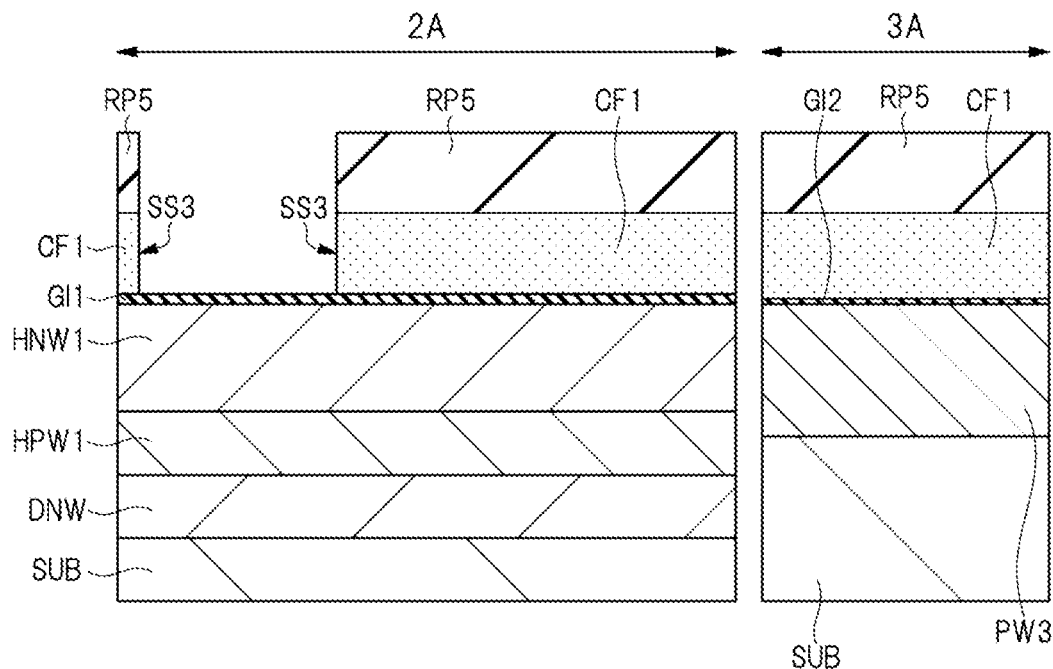
Figure 14:
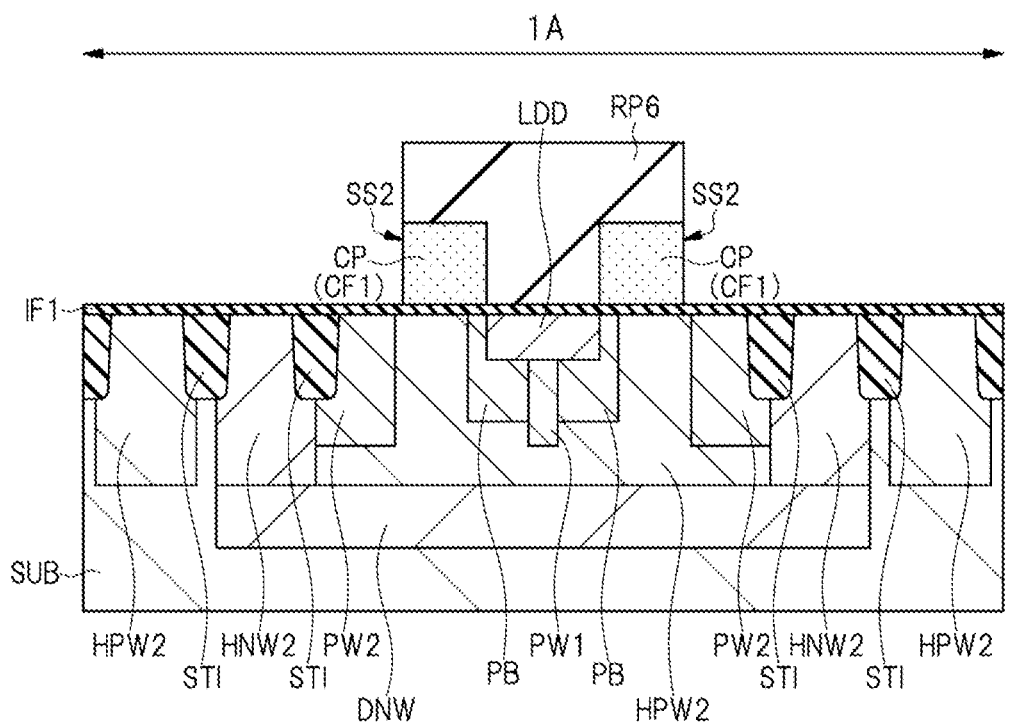
FIG. 14 is a cross-sectional view showing a manufacturing step of the semiconductor device following FIG. 13.
Figure 14:
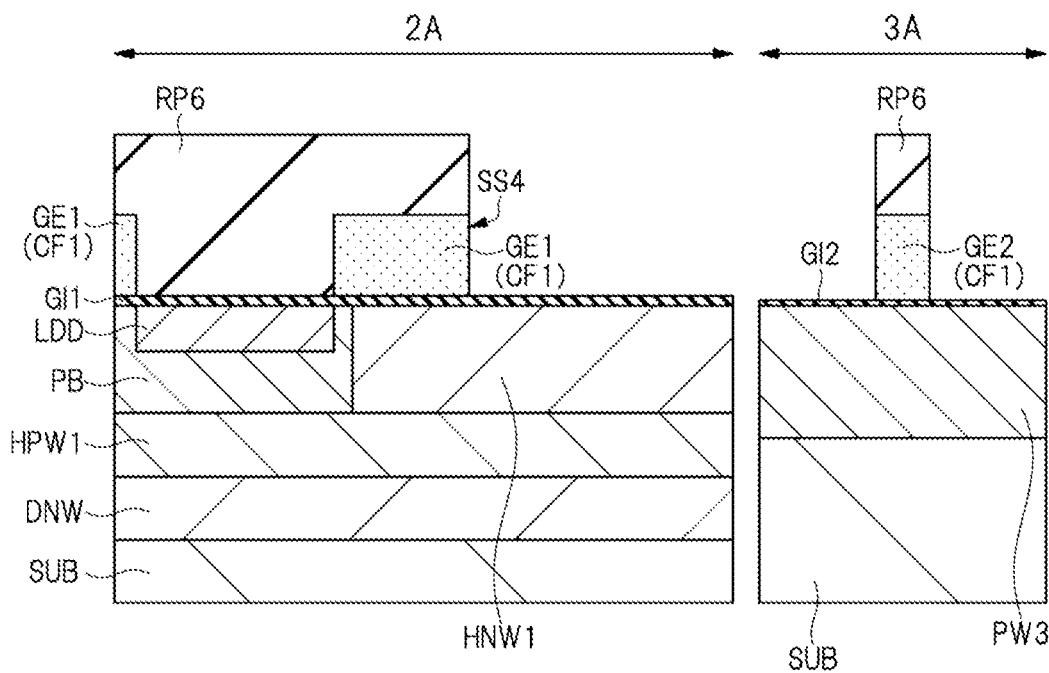

Further, as shown in FIGS. 3, 11, and 14, the conductive pattern CP has the side surface SS1 and the side surface SS2 opposite the side surface SS1. As shown in FIG. 3, the conductive pattern CP is provided with an opening portion, and the side surface SS1 configures the opening portion.

As shown in FIG. 2, the well region PW1, the body region PB, the low concentration diffusion region LDD, and the cathode region NC are formed in the well region HPW2 on a side of the side surface SS1. That is, the well region PW1, the body region PB, the low concentration diffusion region LDD, and the cathode region NC are formed in the well region HPW2 so as to be adjacent to the side surface SS1. A portion of the body region PB is also formed in the well region HPW2 and under the conductive pattern CP. That is, the portion of the body region PB is formed in the well region HPW2 so as to overlap the conductive pattern CP in plan view.

On a side of the side surface SS2, the p-type well region PW2 is formed in the well region HPW2, and the p-type high concentration diffusion region PR is formed in the well region PW2. That is, the p-type well region PW2 is formed in the well region HPW2 so as to be adjacent to the side surface SS2. The high concentration diffusion region PR is formed at the upper surface of the semiconductor substrate SUB in the well region HPW2. The impurity concentration of the high concentration diffusion region PR is higher than the impurity concentration of the well region PW2.

The sidewall spacers SW are formed on the side surface SS1 and the side surface SS2 of the conductive pattern CP. The sidewall spacers SW are formed of, for example, a stacked film including a silicon oxide film and a silicon nitride film formed on the silicon oxide film.

In addition, the silicide films SI are formed on the conductive pattern CP, on the cathode region NC, on the high concentration diffusion region PR, and on the high concentration diffusion region NR. The silicide films SI are made of, for example, cobalt silicide, nickel silicide, or nickel-platinum silicide.

The low concentration diffusion region LDD and the cathode region NC configure the cathode of the Zener diode ZD. The well region HPW2, the well region PW1 on a side of the side surface SS1, the body region PB, the well region PW2 on a side of the side surface SS2, and the high concentration diffusion region PR configure the anode of the Zener diode ZD.

Figure 4:
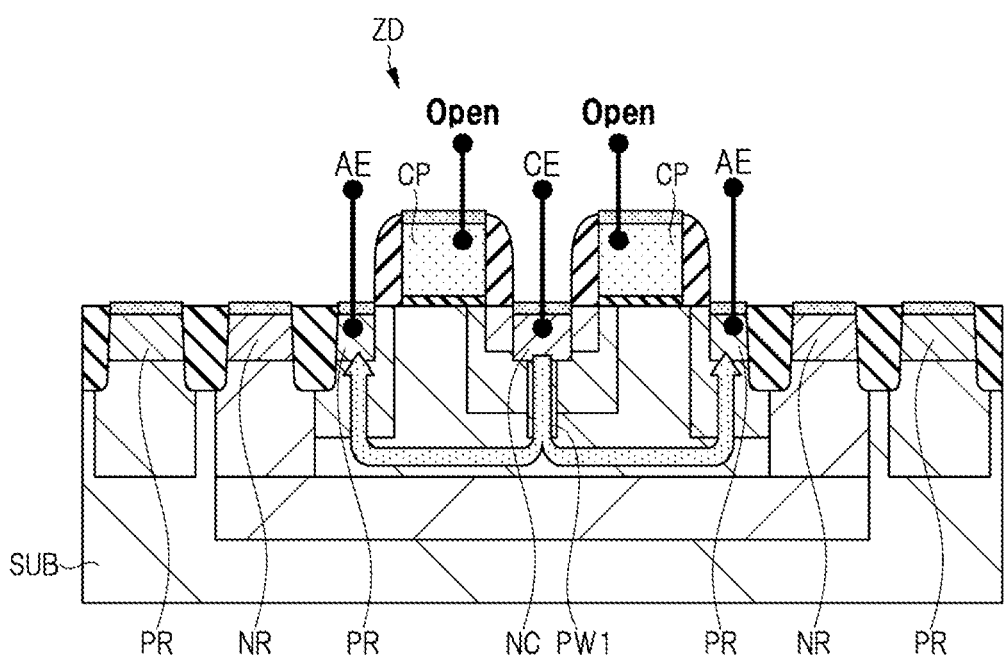
FIG. 4 is a cross-sectional view showing the semiconductor device in the first embodiment.

As shown in FIG. 4, the cathode electrode CE is electrically connected to the cathode region NC, and the anode electrode AE is electrically connected to the high concentration diffusion region PR. In the first embodiment, the conductive pattern CP is not electrically connected to the cathode electrode CE, the anode electrode AE, or the like, and is in an electrically floating state (Open).

Although not shown here, an interlayer dielectric film is formed on the semiconductor substrate SUB. Contact plugs are formed in the interlayer dielectric film, and wirings are formed on the interlayer dielectric film. The cathode electrode CE and the anode electrode AE are, for example, the contact plugs described above. The cathode region NC is connected to the contact plug, which is the cathode electrode CE, via the silicide film SI, and the high concentration diffusion region PR is connected to the contact plug, which is the anode electrode AE, via the silicide film SI. The cathode electrode CE and the anode electrode AE are electrically connected via wiring to another semiconductor device, such as the high withstand voltage MISFET 1Q in the region 2A or the low withstand voltage MISFET 2Q in the region 3A. The contact plug is made of, for example, a conductive film mainly composed of a tungsten film. The wiring is formed of, for example, an aluminum-alloy film or a conductive film mainly including a copper film.

In FIG. 4, the path of the main current flowing through the Zener diode ZD is shown as an arrow. The current mainly flows from the cathode electrode CE to the anode electrode AE through the cathode region NC, the well region PW1 on a side of the side surface SS1, the well region HPW2, the well region PW2 on a side of the side surface SS2, and the high concentration diffusion region PR.

Examined Example and Main Features of First Embodiment

Figure 23:
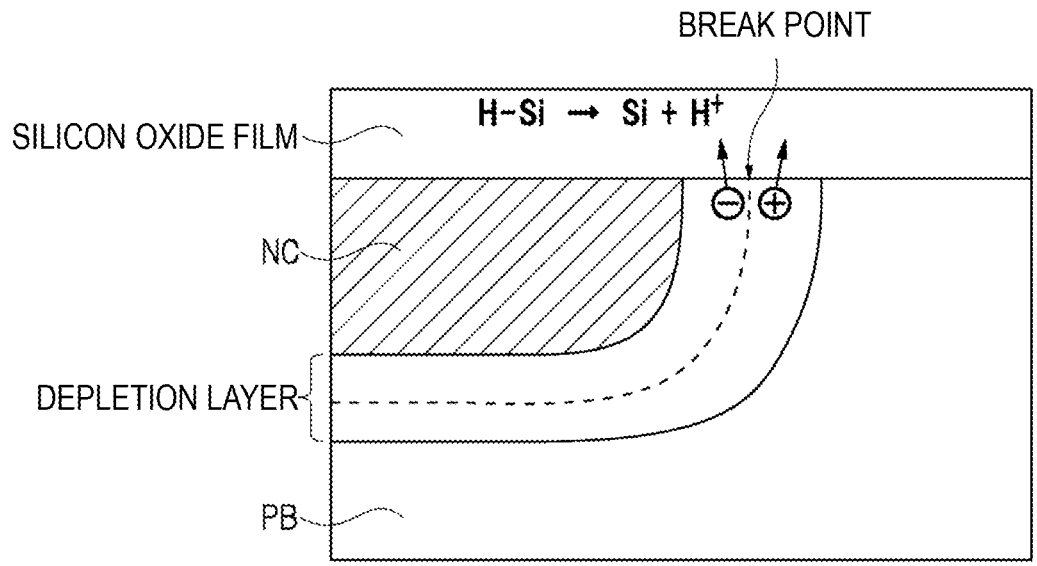
FIG. 23 is a main portion cross-sectional view showing a semiconductor device in an examined example.

FIG. 23 shows a main portion of the Zener diode in the examined example as discussed by the present inventors. As shown in FIG. 23, in the examined example, the cathode region NC is provided in the body region PB, but the high concentration well region PW1 such as first embodiment is not provided.

In the Zener diode in the examined example, breakdowns also occur on the side surface of the cathode region NC. Therefore, a current flows not only from the bottom surface of the cathode region NC but also from the side surface of the cathode region NC to the body region PB. At this time, hot carriers are generated by impact ionization, and hot carriers are injected into the silicon oxide film. Then, the bond (Si—H) between the silicon and the hydrogen in the silicon oxide film is destroyed, and the hydrogen ions ($H^+$) are released to the vicinity of the surface of the body region PB.

The released hydrogen ion ($H^+$) couples to the boron (B) contained in the body region PB (B—H), and inactivates the boron (B). Therefore, the depletion layer expands in the vicinity of the surface of the body region PB, and the breakdown voltage fluctuates. If the fluctuation in the breakdown voltage is large, the breakdown voltage required for the protective circuit 100 may not be maintained.

In the first embodiment, as shown in FIGS. 2 and 3, the high concentration well region PW1 is formed under the cathode region NC so that the cathode region NC includes the well region PW1 in plan view. As a result, breakdown is more likely to occur between the well region PW1 and the cathode region NC than between the body region PB and the cathode region NC. Therefore, as shown in FIG. 4, it is difficult for current to flow from the side surface of the cathode region NC to the body region PB, and the path of the main current flowing through the Zener diode ZD is a path from the cathode region NC to the well region PW1. Therefore, in the first embodiment, it is possible to suppress fluctuations in the breakdown voltage caused by hot carriers such as the examined example, so that the breakdown voltage required for the protective circuit 100 can be maintained, and the reliability of the semiconductor device can be improved.

Further, in the body region PB, the low concentration diffusion region LDD having an impurity concentration lower than that of the cathode region NC is formed. In plan view, the low concentration diffusion region LDD includes the cathode region NC. By such the low concentration diffusion region LDD, the electric field in the vicinity of the side surface of the cathode region NC (under the sidewall spacer SW) can be relaxed, and thus the resistance to hot carriers is also improved.

Further, as will be described in detail later in "MANUFACTURING METHOD OF SEMICONDUCTOR DEVICE", the Zener diode ZD of the first embodiment can be formed using a manufacturing step for forming the low withstand voltage MISFET 1Q in the region 2A and the high withstand voltage MISFET 2Q in the region 3A. That is, since an additional step for forming the Zener diode ZD is not required, the manufacturing cost of the semiconductor device can be suppressed from increasing.

Structure of High Withstand Voltage MISFET 1Q

The high withstand voltage MISFET 1Q in the first embodiment will be described below with reference to FIG. 2.

The n-type well region DNW is formed in the semiconductor substrate SUB in the region 2A. In the semiconductor substrate SUB, the p-type well region HPW1 is formed over the well region DNW. In the semiconductor substrate SUB, the n-type well region HNW1 and the p-type body region PB are formed over the well region HPW1.

The gate dielectric film GI1 is formed on the semiconductor substrate SUB so as to straddle both the well region HNW1 and the body region PB. The gate electrode GE1 is formed on the gate dielectric film GI1. The gate electrode GE1 is disposed between the drain region ND1 and the source region NS1, which will be described later. The gate dielectric film GI1 is, for example, a silicon oxide film. The thickness of the gate dielectric film GI1 is, for example, 5 nm or more and 15 nm or less. The gate electrode GE1 is, for example, a polycrystalline silicon film in which n-type impurities are implanted.

As shown in FIGS. 11 and 14, the gate electrode GE1 has the side surface SS3 and the side surface SS4 opposite the side surface SS3. Sidewall spacers SW are formed on the side surface SS3 and the side surface SS4.

In the well region HNW1, the n-type drain region ND1 is formed away from the side surface SS4 of the gate electrode GE1. In the body region PB, the n-type low concentration diffusion region LDD, the n-type source region NS1, and the p-type high concentration diffusion region PR are formed. The low concentration diffusion region LDD is formed under the sidewall spacer SW on the side surface SS3. The source region NS1 is formed away from the side surface SS3, and the low concentration diffusion region LDD is disposed between the source region NS1 and the side surface SS3. The high concentration diffusion region PR is formed away from the side surface SS3, and the source region NS1 is disposed between the high concentration diffusion region PR and the low concentration diffusion region LDD.

The impurity concentration of each of the drain region ND1 and the source region NS1 is higher than the impurity concentration of each of the low concentration diffusion region LDD and the well region HNW1. The drain region ND1 and the well region HNW1 configure the drain of the high withstand voltage MISFET 1Q. The source region NS1 and the low concentration diffusion region LDD configure the source of the high withstand voltage MISFET 1Q. In the body region PB, a region located between the low concentration diffusion region LDD and the well region HNW1 and located under the gate electrode GE1 configures a channel region of the high withstand voltage MISFET 1Q.

The dielectric film IF2 is formed on the semiconductor substrate SUB so as to cover a portion of the gate electrode GE1, the sidewall spacers SW, and the well region HNW1. The dielectric film IF2 is, for example, a silicon oxide film. The silicide film SI is formed on the region exposed from the dielectric film IF2 and the sidewall spacers SW. That is, the silicide films SI are formed on the gate electrode GE1, the drain region ND1, the source region NS1, and the high concentration diffusion region PR.

Structure of Low Withstand Voltage MISFET 2Q

The low withstand voltage MISFET 2Q in the first embodiment will be described below with reference to FIG. 2.

The p-type well region PW3 is formed in the semiconductor substrate SUB in the region 3A. The gate dielectric film GI2 is formed on the well region PW3. The gate electrode GE2 is formed on the gate dielectric film GI2. The gate electrode GE2 is disposed between the drain region ND2 and the source region NS2, which will be described later. The gate dielectric film GI2 is, for example, a silicon oxide film. The thickness of the gate dielectric film GI2 is smaller than the thickness of the gate dielectric film GI1, for example, 2 nm or more and 5 nm or less. The gate electrode GE2 is, for example, a polycrystalline silicon film in which n-type impurities are implanted.

The sidewall spacers SW are formed on both side surfaces of the gate electrode GE2. In the well region PW3, the n-type low concentration diffusion region EX is formed under the sidewall spacer SW. In the well region PW3, the n-type drain region ND2 and the n-type source region NS2 are formed apart from both side surfaces of the gate electrode GE2. The low concentration diffusion region EX is formed between one side surface of the gate electrode GE2 and the drain region ND2 and between the other side surface of the gate electrode GE2 and the source region NS2.

The impurity concentration of each of the drain region ND2 and the source region NS2 is higher than the impurity concentration of the low concentration diffusion region EX. The drain region ND2 and one low concentration diffusion region EX configure the drain of the low withstand voltage MISFET 2Q. The source region NS2 and the other low concentration diffusion region EX configure the source of the low withstand voltage MISFET 2Q. In the well region PW3, a region located between the two low concentration diffusion regions LDD and located under the gate electrode GE2 configures a channel region of the low withstand voltage MISFET 2Q.

The silicide films SI are formed on the gate electrode GE2, the drain region ND2, and the source region NS2.

Manufacturing Method of Semiconductor Device

The respective manufacturing steps included in the manufacturing method of the semiconductor device in the first embodiment will be described below with reference to FIG. 5 to FIG. 21.

Figure 5:
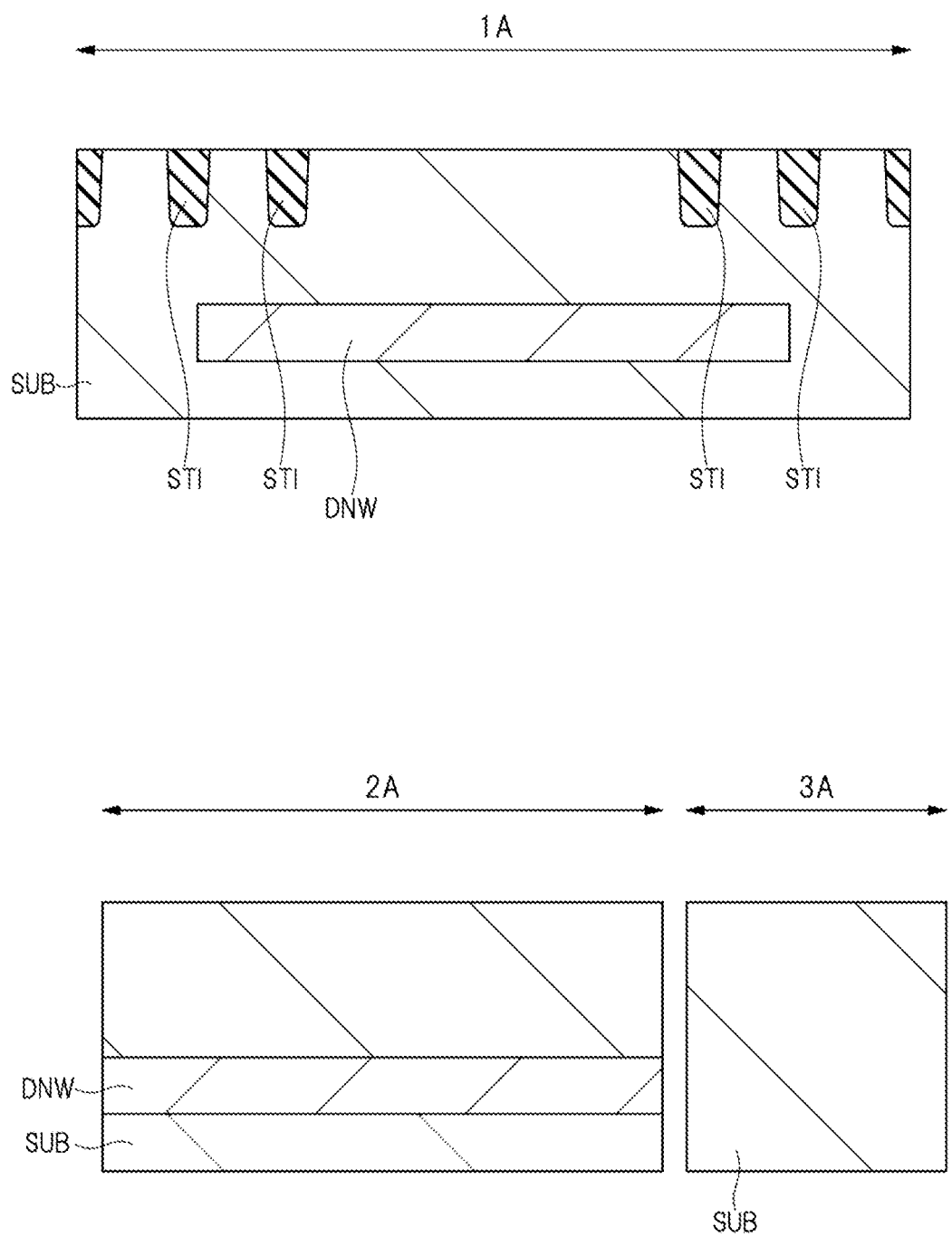
FIG. 5 is a cross-sectional view showing a manufacturing step of the semiconductor device in the first embodiment.

As shown in FIG. 5, first, the semiconductor substrate SUB is prepared. Next, the n-type well region DNW is formed in the semiconductor substrate SUB in the regions 1A, 2A by a photolithography technique and an ion-implantation method.

Next, a plurality of trenches are formed in the semiconductor substrate SUB. The dielectric film is embedded in the trenches, and the dielectric film formed outside the trenches is removed by a CMP (Chemical Mechanical Polishing) method or the like to form the element isolation portion STI in the semiconductor substrate SUB.

Figure 6:
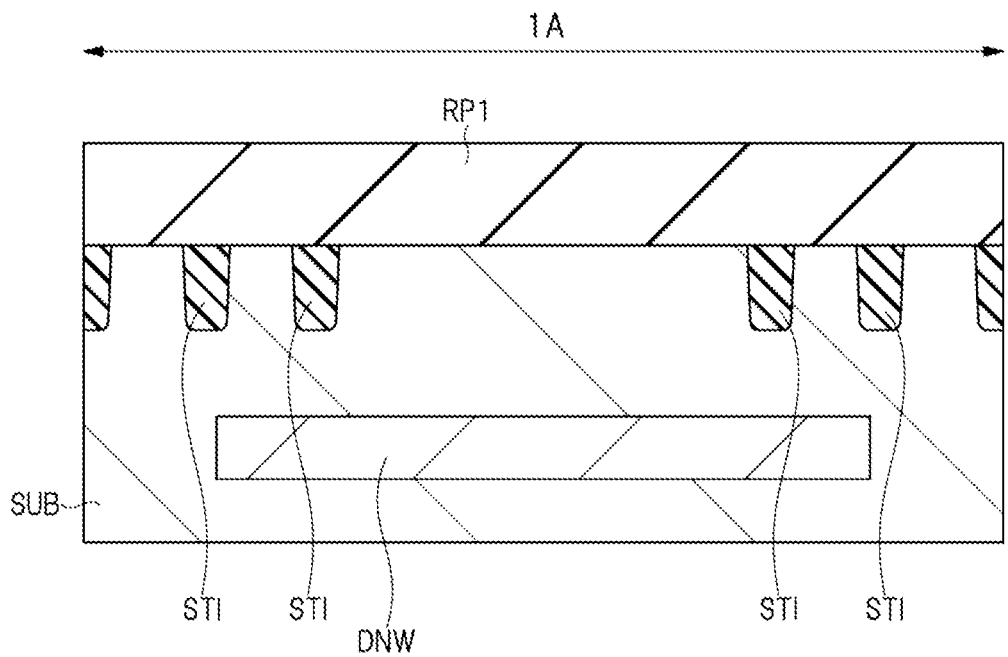
FIG. 6 is a cross-sectional view showing a manufacturing step of the semiconductor device following FIG. 5.
Figure 6:
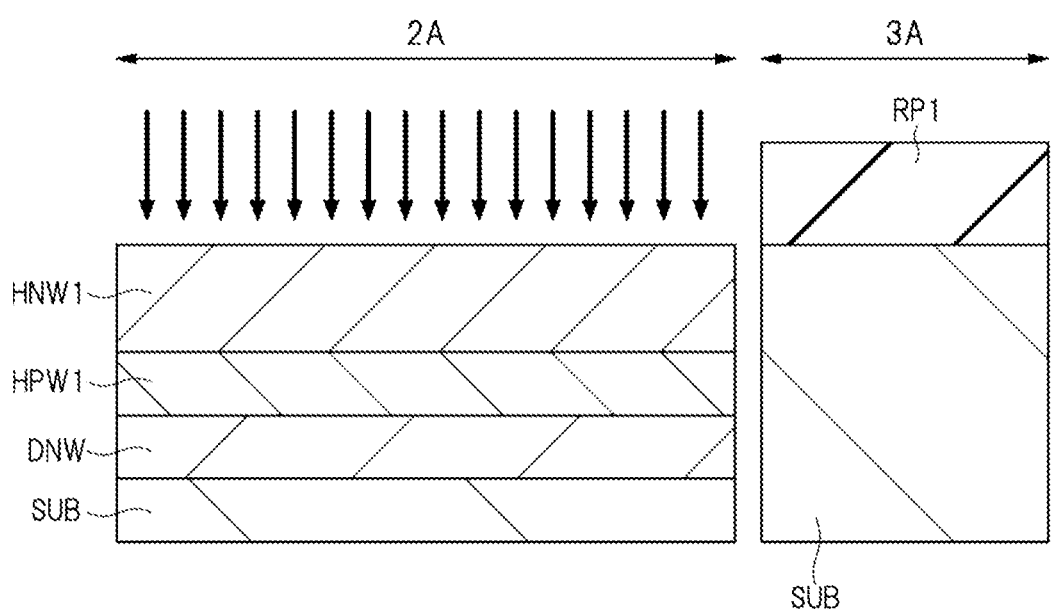

As shown in FIG. 6, first, the resist pattern RP1 is formed on the semiconductor substrate SUB in the regions 1A and 3A. Next, by performing an ion-implantation using the resist pattern RP1 as a mask, the p-type well region HPW1 and the n-type well region HNW1 are formed in the semiconductor substrate SUB in the region 2A. Thereafter, the resist pattern RP1 is removed by an ashing process.

The ion-implantation for forming the well regions HPW1 is performed using, for example, boron (B) or boron difluoride ($BF_2$) as impurities, and is performed in a condition in which the implantation energy of the impurities is, for example, 400 keV or more and 500 keV or less, and the dose amount of the impurities is, for example, $1.0 \times 10^{12}/cm^2$ or more and $5.0 \times 10^{13}/cm^2$ or less.

The ion-implantation for forming the well region HNW1 is performed using, for example, phosphorus (P) as impurities, and is performed in a condition in which the implantation energy of the impurities is, for example, 20 keV or more and 350 keV or less, and the dose amount of the impurities is, for example, $1.0 \times 10^{12}/cm^2$ or more and $5.0 \times 10^{13}/cm^2$ or less. Incidentally, the well region HNW1 may be formed by a plurality of times of ion-implantation with different implantation energies to each other within the above-described scope.

Figure 7:
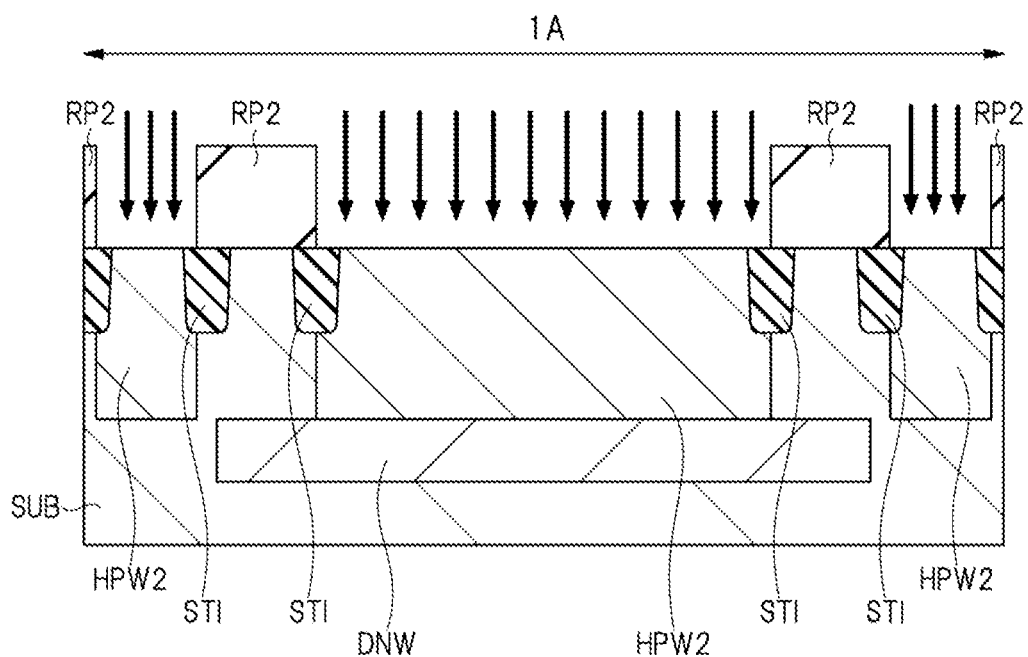
FIG. 7 is a cross-sectional view showing a manufacturing step of the semiconductor device following FIG. 6.
Figure 7:
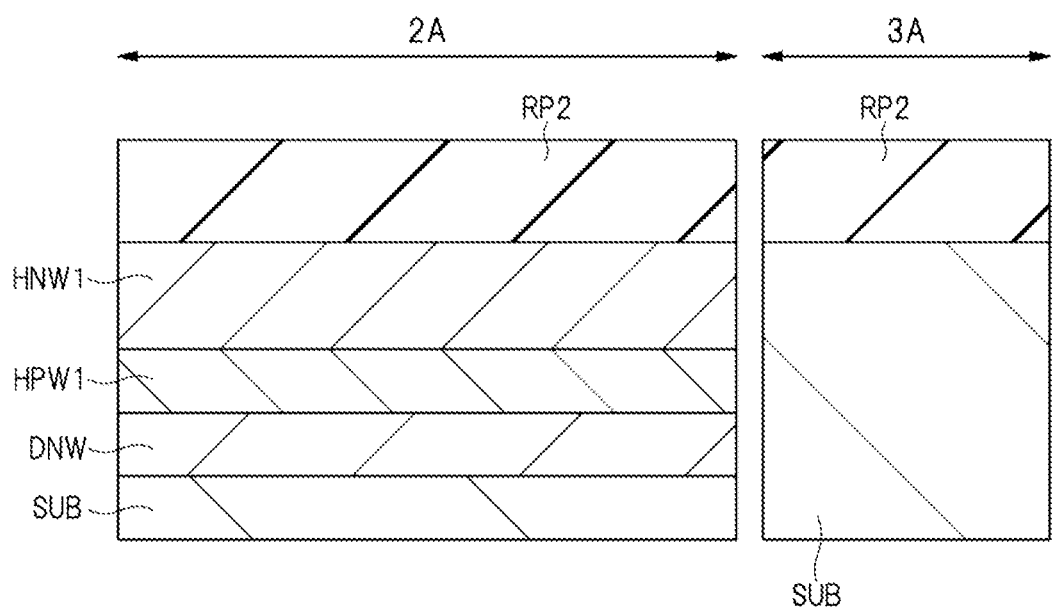

As shown in FIG. 7, the resist pattern RP2 is first formed on the semiconductor substrate SUB in a portion of the region 1A, the region 2A, and the region 3A. Next, by performing an ion-implantation using the resist pattern RP2 as a mask, the p-type well region HPW2 is formed in the semiconductor substrate SUB in a portion of the region 1A. Thereafter, the resist pattern RP2 is removed by an ashing process.

The ion-implantation for forming the well region HPW2 is performed using, for example, boron (B) or boron difluoride ($BF_2$) as impurities, and is performed in a condition in which the implantation energy of the impurities is, for example, 10 keV or more and 400 keV or less, and the dose amount of the impurities is, for example, $1.0 \times 1011/cm^2$ or more and $5.0 \times 10^{13}/cm^2$ or less. Incidentally, the well region HPW2 may be formed by a plurality of times of ion-implantation with different implantation energies to each other within the above-described scope.

Figure 8:
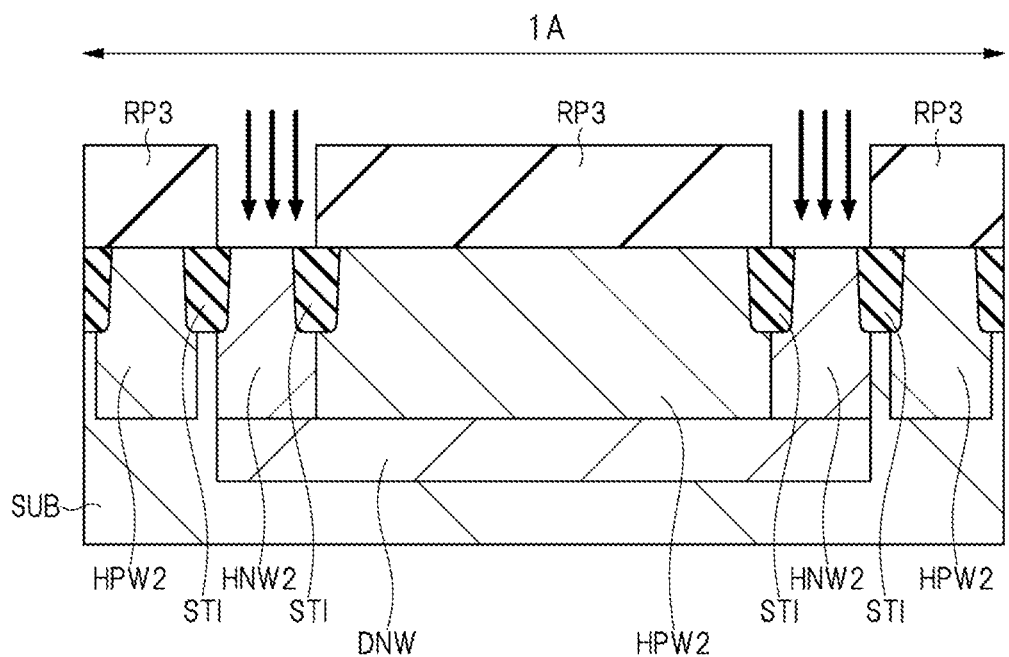
FIG. 8 is a cross-sectional view showing a manufacturing step of the semiconductor device following FIG. 7.
Figure 8:
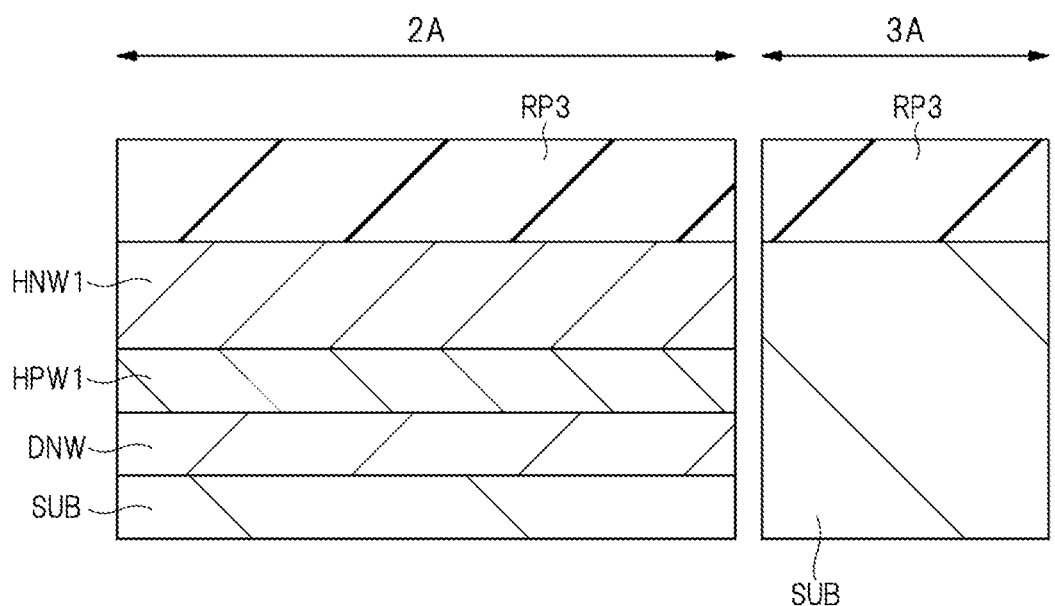

As shown in FIG. 8, the resist pattern RP3 is first formed on the semiconductor substrate SUB in a portion of the region 1A, the region 2A, and the region 3A. Next, by performing an ion-implantation using the resist pattern RP3 as a mask, the n-type well region HNW2 is formed in the semiconductor substrate SUB in a portion of the region 1A. Thereafter, the resist pattern RP3 is removed by ashing.

The ion-implantation for forming the well region HNW2 is performed using, for example, phosphorus (P) as impurities, and is performed in a condition in which the implantation energy of the impurities is, for example, 50 keV or more and 1000 keV or less, and the dose amount of the impurities is, for example, $1.0 \times 10^{12}/cm^2$ or more and $5.0 \times 10^{13}/cm^2$ or less. Incidentally, the well region HNW2 may be formed by a plurality of times of ion-implantation with different implantation energies to each other within the above-described scope.

Figure 9:
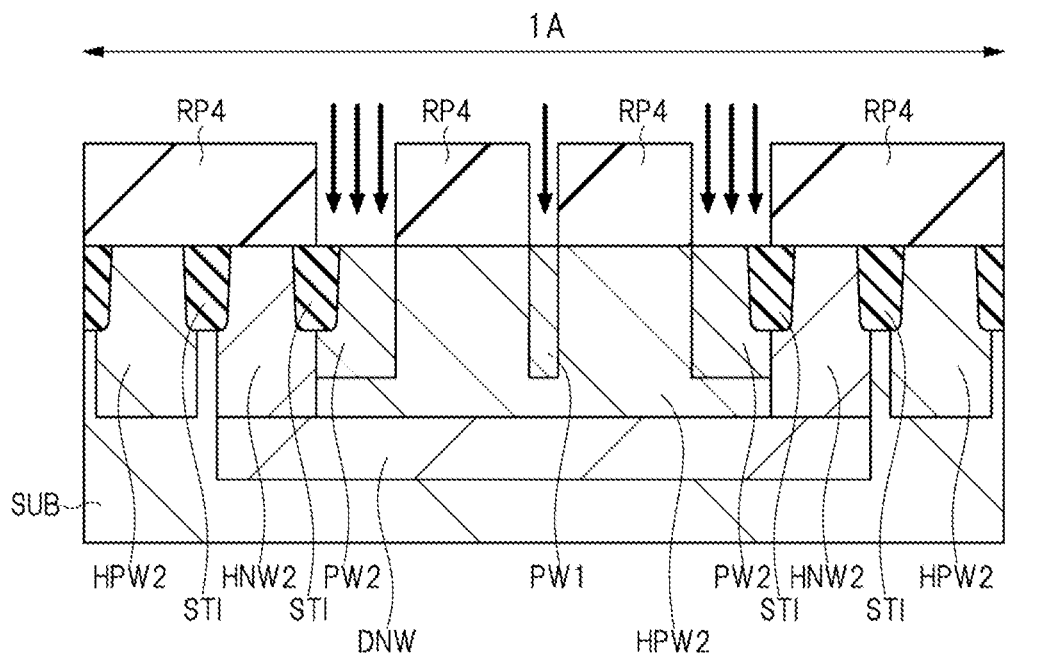
FIG. 9 is a cross-sectional view showing a manufacturing step of the semiconductor device following FIG. 8.
Figure 9:
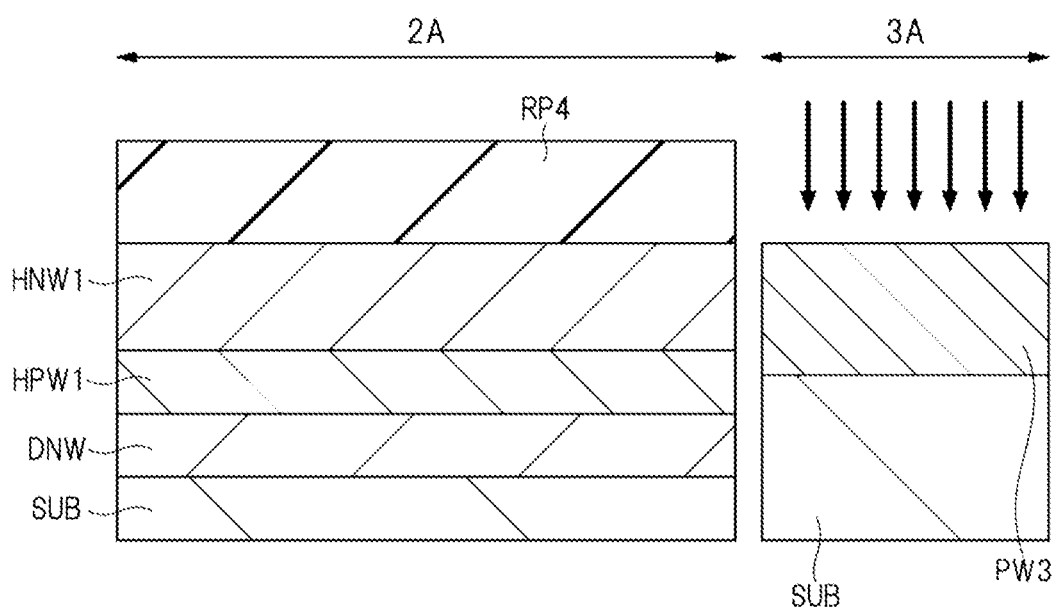

As shown in FIG. 9, first, the resist pattern RP4 is formed on the semiconductor substrate SUB in a portion of the region 1A and the region 2A. Next, by performing an ion-implantation using the resist pattern RP4 as a mask, the p-type well regions PW1, PW2 is formed in the semiconductor substrate SUB a portion of the region 1A, and the p-type well region PW3 is formed in the semiconductor substrate SUB in the region 3A. Thereafter, the resist pattern RP4 is removed by ashing.

The ion-implantation for forming the well regions PW1, PW2, PW3 is performed using, for example, boron (B) as impurities, and is performed in a condition in which the implantation energy of the impurities is, for example, 30 keV or more and 150 keV or less, and the dose amount of the impurities is, for example, $1.0 \times 10^{12}/cm^2$ or more and $5.0 \times 10^{13}/cm^2$ or less. Incidentally, the well region PW may be formed by a plurality of times of ion-implantation with different implantation energies to each other within the above-described scope.

Figure 10:
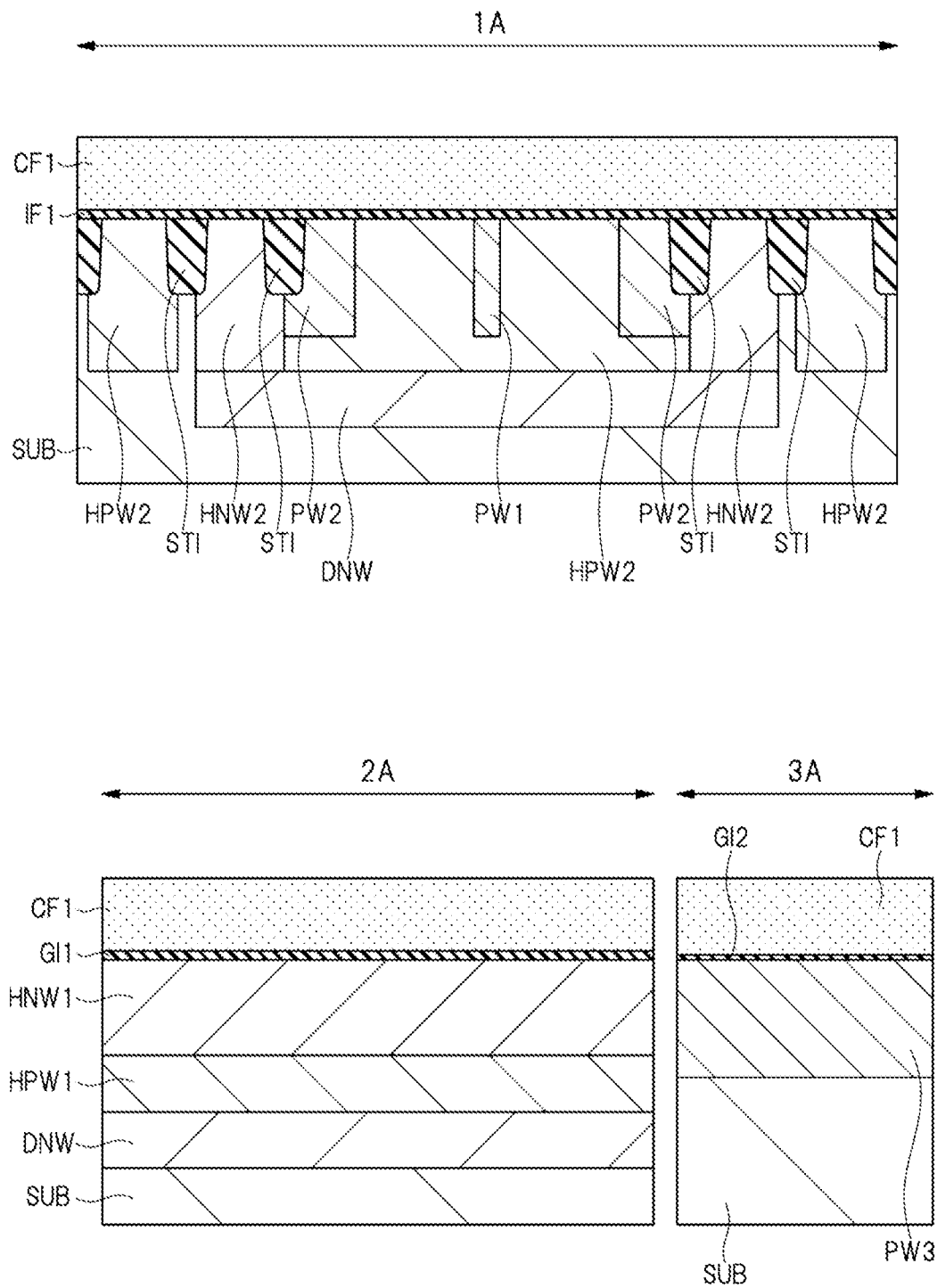
FIG. 10 is a cross-sectional view showing a manufacturing step of the semiconductor device following FIG. 9.

As shown in FIG. 10, a relatively thick silicon oxide film is first formed on the well regions HPW2, HNW2, PW1, PW2 in the region 1A, on the well region HNW1 in the region 2A, and on the well region PW3 in the region 3A by, for example, a thermal oxidation treatment. Next, the thick silicon oxide film in the region 3A is selectively removed by a photolithography technique and an isotropic etching process. Next, a relatively thin silicon oxide film is formed on the well region PW3 in the region 3A by, for example, a thermal oxidation treatment. In FIG. 10, the thick silicon oxide film formed in the region 1A is shown as the dielectric film IF1, the thick silicon oxide film formed in the region 2A is shown as the gate dielectric film GI1, and the thin silicon oxide film formed in the region 3A is shown as the gate dielectric film GI2.

Next, the conductive film CF1 is formed on the dielectric film IF1, the gate dielectric film GI1, and the gate dielectric film GI2 by, for example, a CVD (Chemical Vapor Deposition) method. The conductive film CF1 is a polycrystalline silicon film. Next, n-type impurities are implanted into the conductive film CF1 by an ion-implantation method.

As shown in FIG. 11, the resist pattern RP5 is first formed on the conductive film CF1 in a portion of the region 1A, a portion of the region 2A, and the region 3A. Next, an anisotropic etching process is performed using the resist pattern RP5 as a mask to selectively pattern the conductive film CF1 in the region 1A and the region 2A. By this patterning, the side surface SS1 of the conductive pattern CP is formed in the region 1A, and the side surface SS3 of the gate electrode GE1 is formed in the region 2A. The side surface SS1 configures an opening portion, and the dielectric film IF1 is exposed in the opening portion. Note that the resist pattern RP5 is not removed at this time, and is also used in the manufacturing steps of FIGS. 12 and 13 described later.

Figure 12:
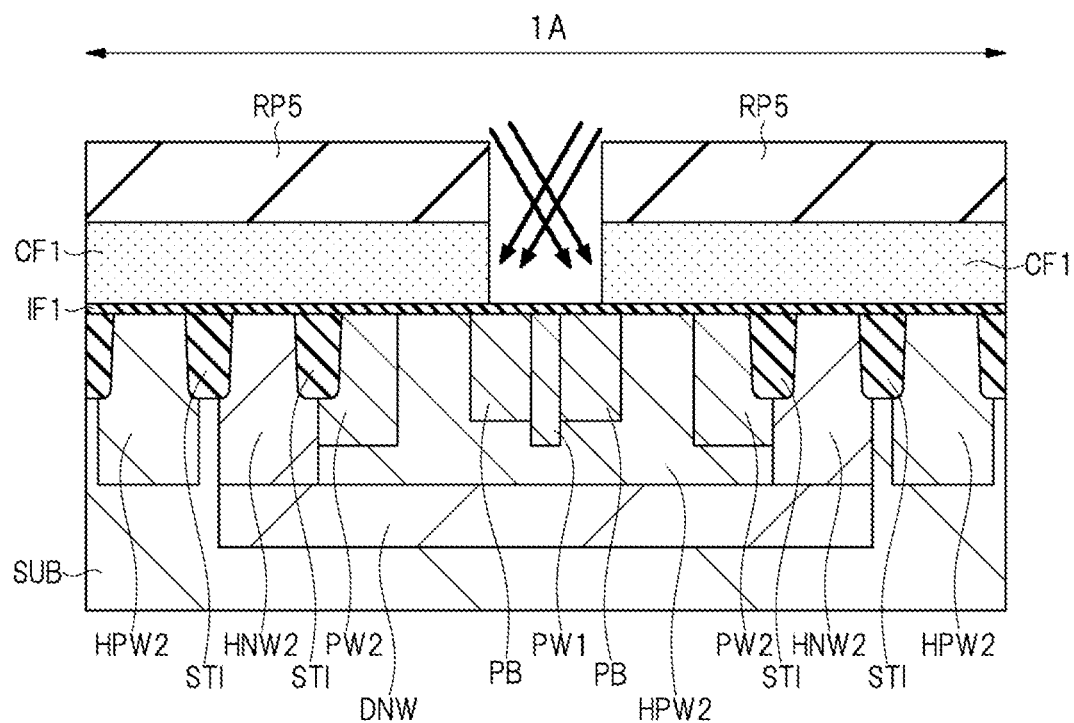
FIG. 12 is a cross-sectional view showing a manufacturing step of the semiconductor device following FIG. 11.
Figure 12:
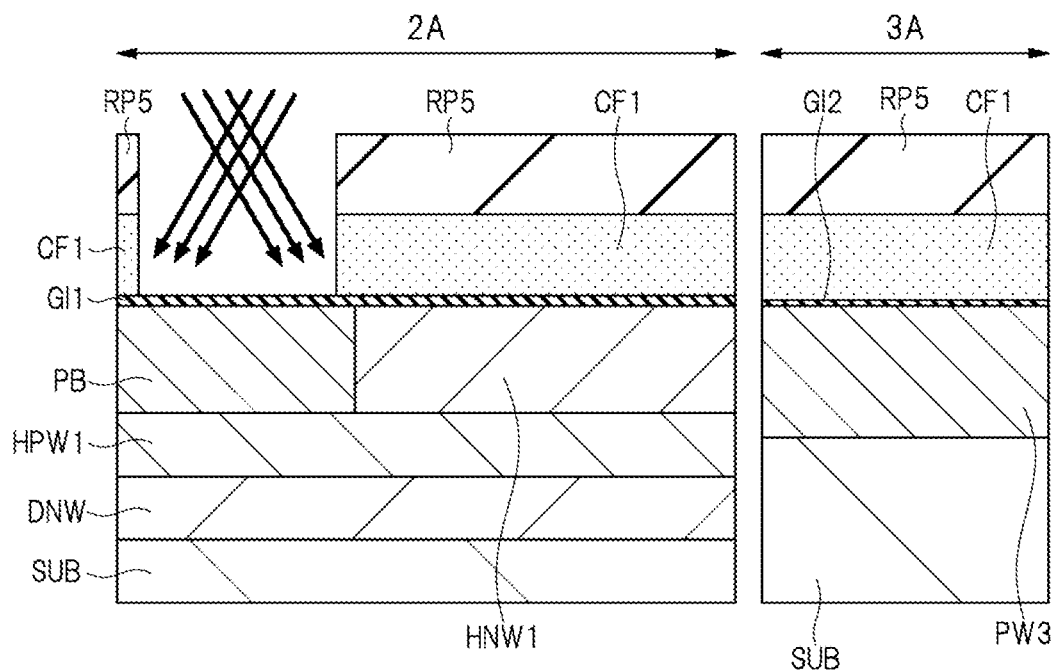

As shown in FIG. 12, by performing an ion-implantation using the resist pattern RP5 as a mask, the p-type body region PB is formed in the well region HPW2 in the region 1A and in the well region HNW1 in the region 2A.

The ion-implantation for forming the body region PB is performed using, for example, boron (B) as impurities, and is performed in a condition in which the implantation energy of the impurities is, for example, 40 keV or more and 90 keV or less, and the dose amount of the impurities is, for example, $1 \times 10^{12}/cm^2$ or more and $5 \times 10^{13}/cm^2$ or less. Further, the ion-implantation is performed using oblique ion-implantation. That is, the ion-implantation is performed at an angle inclined, for example, to 20 degrees or more and 40 degrees or less from a normal line with respect to the upper surface of the semiconductor substrate SUB. Incidentally, the oblique ion-implantation is performed four times, and is performed by rotating the semiconductor substrate SUB by 90 degrees every time. It should be noted that the body region PB may be formed by a plurality of times of ion-implantation with different implantation energies.

By the oblique ion-implantation, the body region PB in the region 1A is formed not only in the well region HPW2 on a side of the side surface SS1 but also under the conductive film CF1 and in the well region HPW2. That is, in the region 1A, the body region PB is formed in the well region HPW2 so as to be adjacent to the side surface SS1, and a portion of the body region PB is formed in the well region HPW2 so as to overlap the conductive pattern CP in plan view, as shown in FIG. 3. Further, by the oblique ion-implantation, the body region PB in the region 2A is formed not only in the well region HNW1 on a side of the side surface SS3 but also under the conductive film CF1 and in the well region HNW1. That is, in the region 2A, the body region PB is formed in the well region HNW1 adjacent to the side surface SS3 and in the well region HNW1 under the conductive film CF1. Impurities are also implanted into the well region PW1 by ion-implantation to form the body region PB. Therefore, the impurity concentration of the well region PW1 becomes higher than the impurity concentration of the body region PB.

Note that the body region PB may be formed by vertical ion-implantation instead of oblique ion-implantation so that the body region PB includes the well region PW1. However, in the vertical ion-implantation, impurities are hardly implanted under the conductive pattern. Therefore, when the body region PB is formed by the vertical ion-implantation, the planar area of the opening portion configured by the side surface SS1 of the conductive pattern CP needs to be increased as compared with the case where the body region PB is formed by the oblique ion-implantation. When oblique ion-implantation is used, impurities can also be implanted under the conductive pattern CP, so that the planar area of the opening portion configured by the side surface SS1 of the conductive pattern CP can be narrowed. As a result, the conductive pattern CP can be formed to be small in plan view, so that the semiconductor device can be miniaturized. Therefore, the body region PB is preferably formed by oblique ion-implantation.

Figure 13:
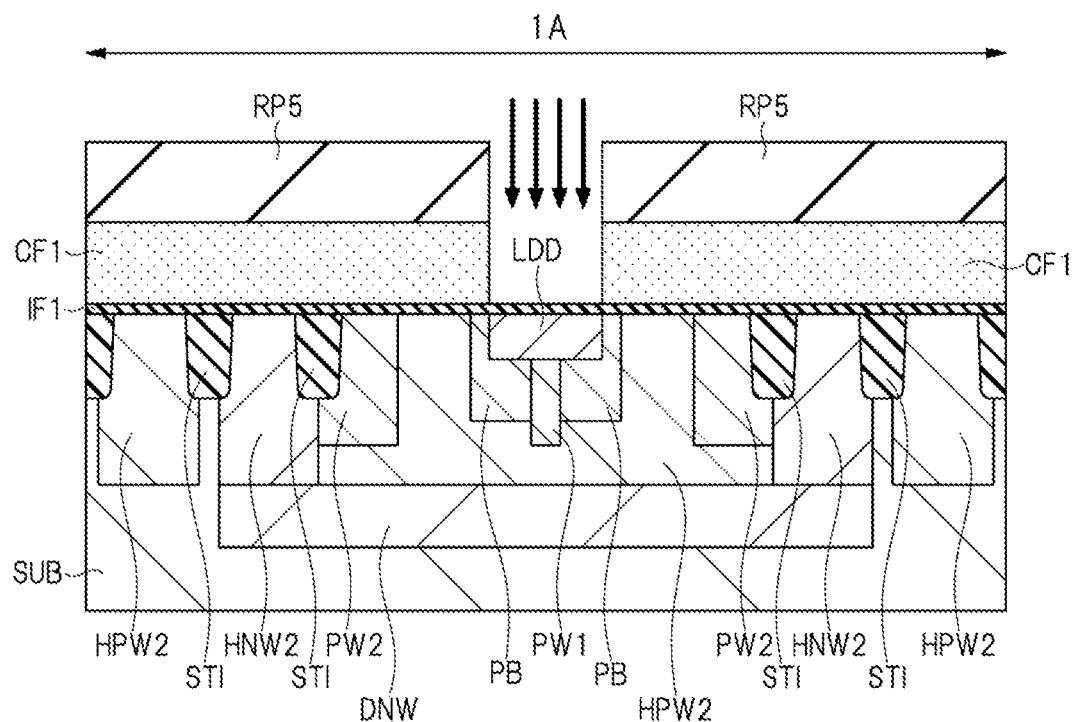
FIG. 13 is a cross-sectional view showing a manufacturing step of the semiconductor device following FIG. 12.
Figure 13:
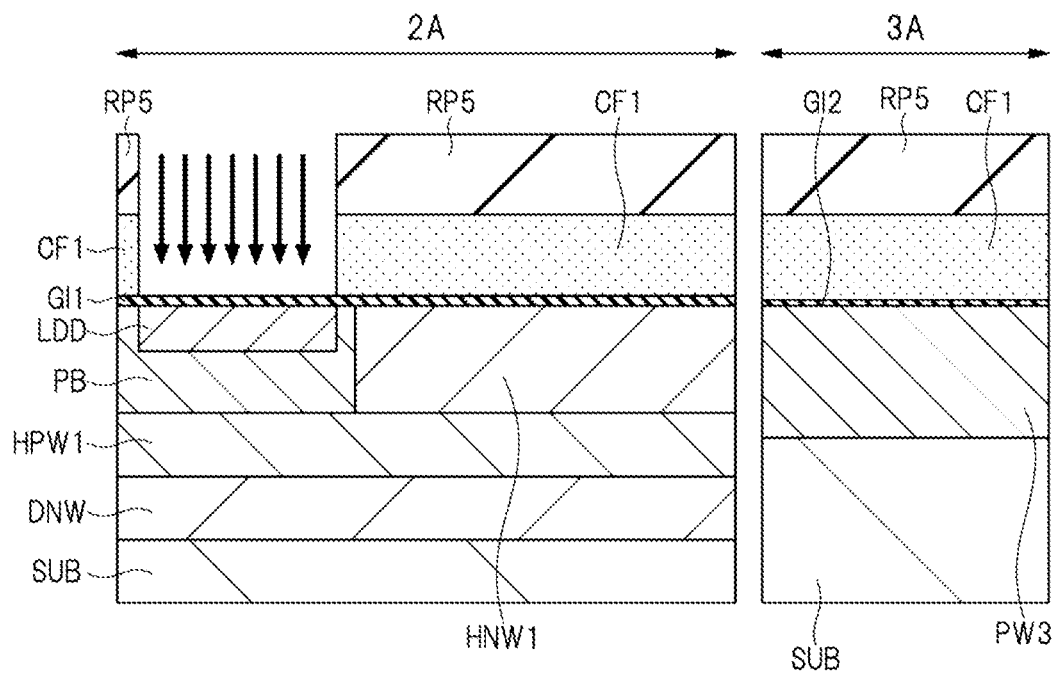

As shown in FIG. 13, by performing an ion-implantation using the resist pattern RP5 as a mask, the n-type low concentration diffusion regions LDD are formed in the well region HPW2 on a side of the side surface SS1 in the region 1A and in the well region HNW1 on a side of the side surface SS3 in the region 2A. That is, the low concentration diffusion region LDD is formed in the well region HPW2 so as to be adjacent to the side surface SS1. Thereafter, the resist pattern RP5 is removed by ashing. Note that either the step of forming the body region PB or the step of forming the low concentration diffusion region LDD may be performed first.

The ion-implantation for forming the low concentration diffusion regions LDD is performed using, for example, arsenic (As) as impurities, and is performed in a condition in which the implantation energy of the impurities is, for example, 20 keV or more and 60 keV or less, and the dose amount of the impurities is, for example, $1.0 \times 10^{14}/cm^2$ or more and $5.0 \times 10^{14}/cm^2$ or less.

As shown in FIG. 14, first, the resist pattern RP6 is formed on the conductive film CF1 in a portion of the region 1A, a portion of the region 2A, and a portion of the region 3A. The resist pattern RP6 covers the side surface SS1 of the conductive pattern CP and the side surface SS3 of the gate electrode GE1.

Next, an anisotropic etching process is performed using the resist pattern RP6 as a mask to selectively pattern the conductive film CF1 in the region 1A, the region 2A, and the region 3A. By this patterning, the conductive pattern CP having the side surface SS1 and the side surface SS2 is formed in the region 1A, the gate electrode GE1 having the side surface SS3 and the side surface SS4 is formed in the region 2A, and the gate electrode GE2 is formed in the region 3A. Thereafter, the resist pattern RP6 is removed by ashing.

Further, the dielectric film IF1, the gate dielectric film GI1, and the gate dielectric film GI2 which are exposed from the conductive pattern CP, the gate electrode GE1, and the gate electrode GE2 are removed by the isotropic etching process.

Figure 15:
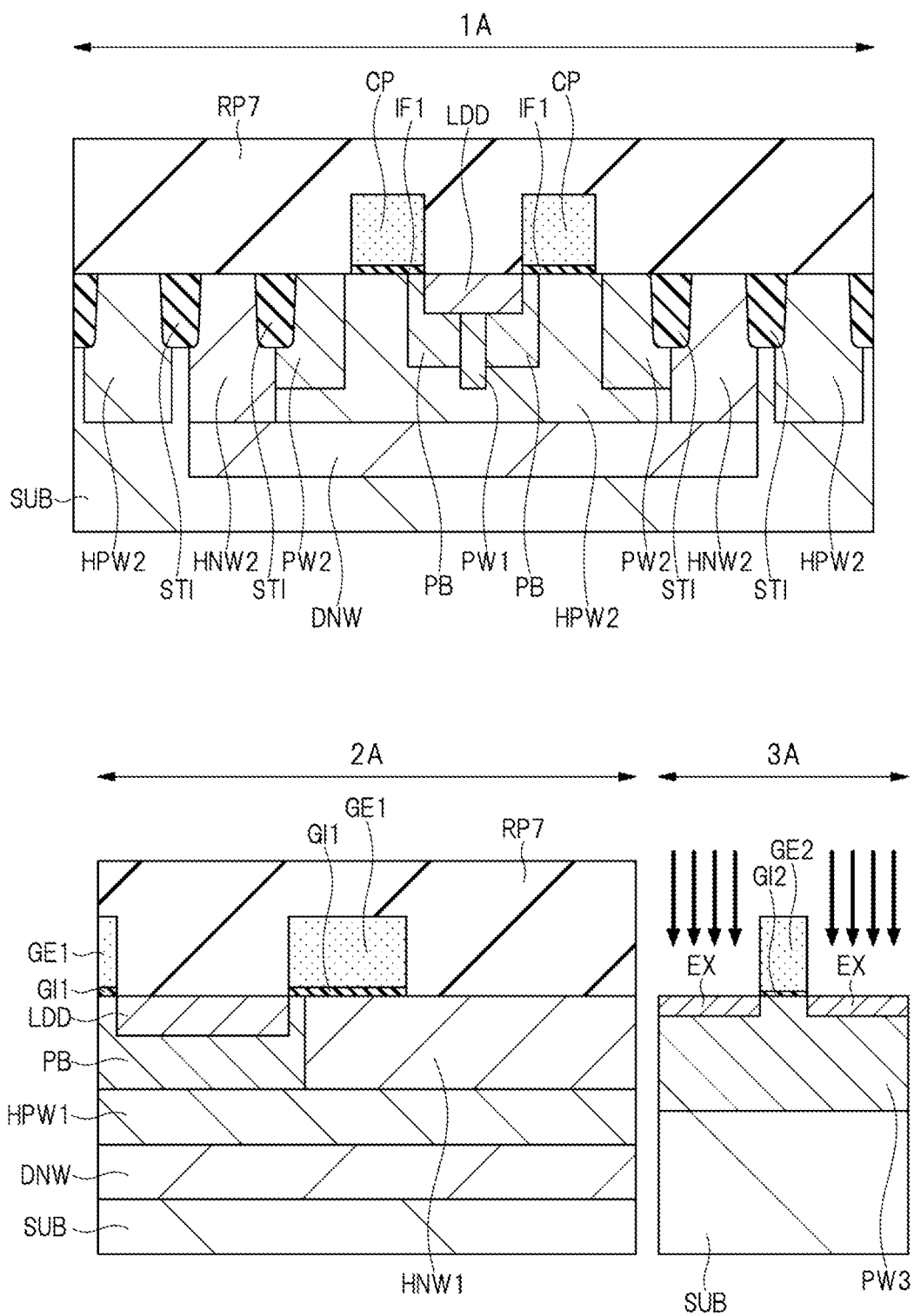
FIG. 15 is a cross-sectional view showing a manufacturing step of the semiconductor device following FIG. 14.

As shown in FIG. 15, the resist pattern RP7 is first formed on the semiconductor substrate SUB in the regions 1A and 2A. Next, an ion-implantation is performed using the resist pattern RP7 as a mask to form the n-type low concentration diffusion regions EX in the well region PW3 in the region 3A. Thereafter, the resist pattern RP7 is removed by ashing.

The ion-implantation for forming the low concentration diffusion regions EX is performed using, for example, phosphorus (P), arsenic (As), and boron difluoride (BF2) as impurities, and is performed in a condition in which the implantation energy of the impurities is, for example, 10 keV or more and 50 keV or less, and the dose amount of the impurities is, for example, $1.0 \times 10^{12}/cm^2$ or more and $1.0 \times 10^{14}/cm^2$ or less. Further, the ion-implantation is performed using oblique ion-implantation. That is, the ion-implantation is performed at an angle inclined, for example, to 0 degree or more and 45 degrees or less from a normal line with respect to the upper surface of the semiconductor substrate SUB. The low concentration diffusion regions EX may be formed by a plurality of times of ion-implantation with different implantation energies.

Figure 16:
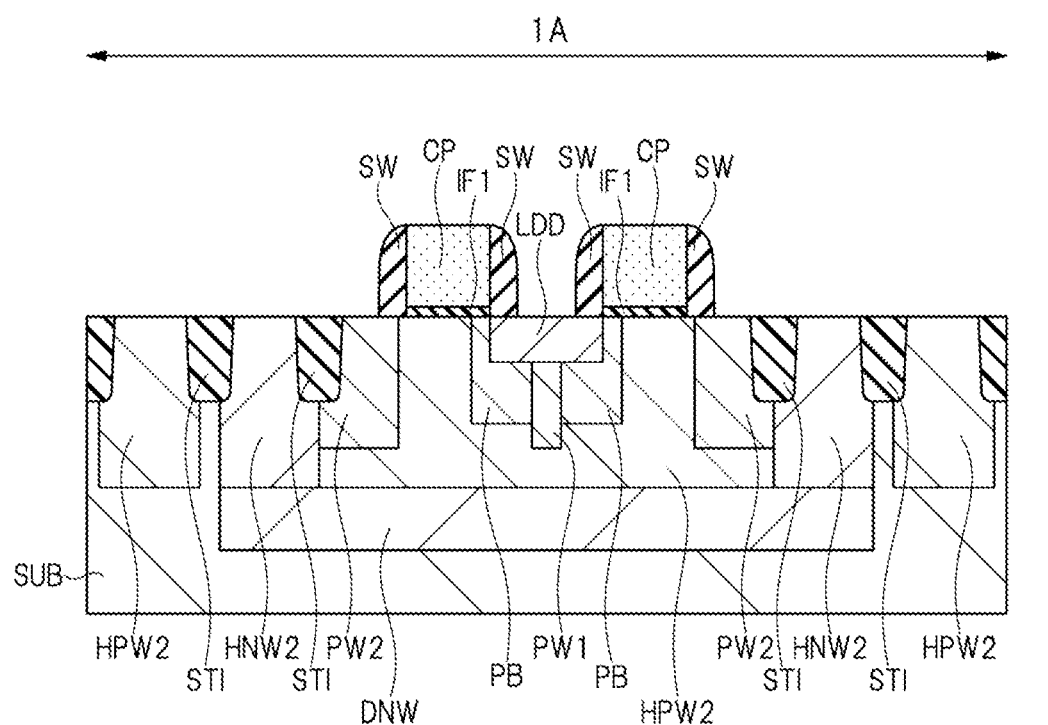
FIG. 16 is a cross-sectional view showing a manufacturing step of the semiconductor device following FIG. 15.
Figure 16:
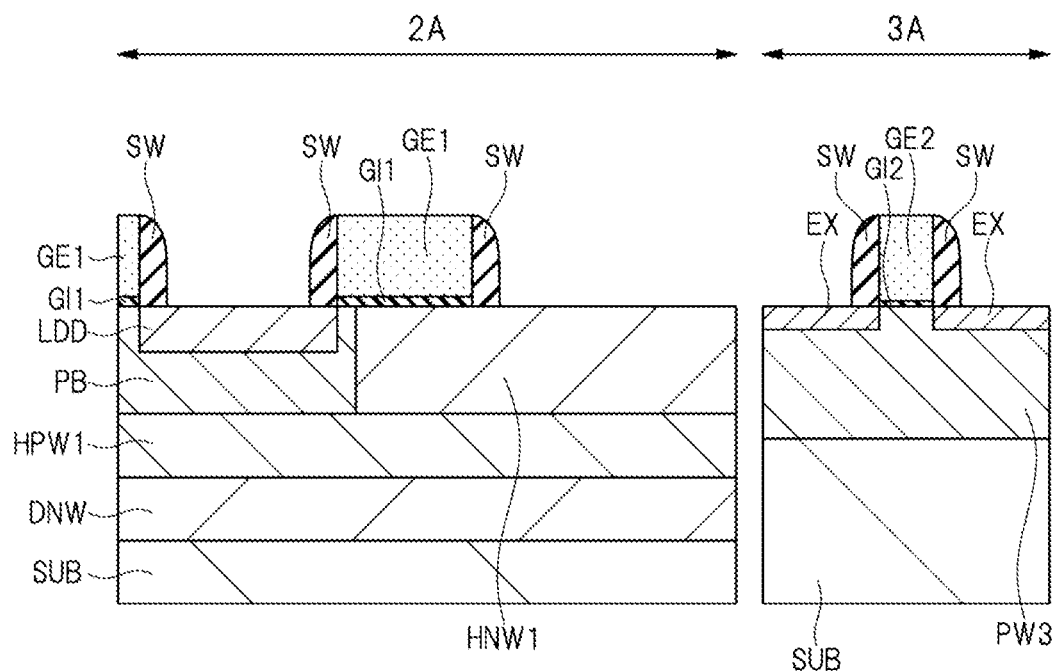

As shown in FIG. 16, the sidewall spacers SW are formed on the side surface SS1 and the side surface SS2 of the conductive pattern CP, on the side surface SS3 and the side surface SS4 of the gate electrode GE1, and on both side surfaces of the gate electrode GE2.

First, a silicon oxide film is formed on the semiconductor substrate SUB so as to cover the conductive pattern CP, the gate electrode GE1, and the gate electrode GE2 by, for example, a CVD method. Next, a silicon nitride film is formed on the silicon oxide film by, for example, a CVD method. Next, an anisotropic etching process is performed on the stacked film including the silicon oxide film and the silicon nitride film to form the sidewall spacers SW.

Figure 17:
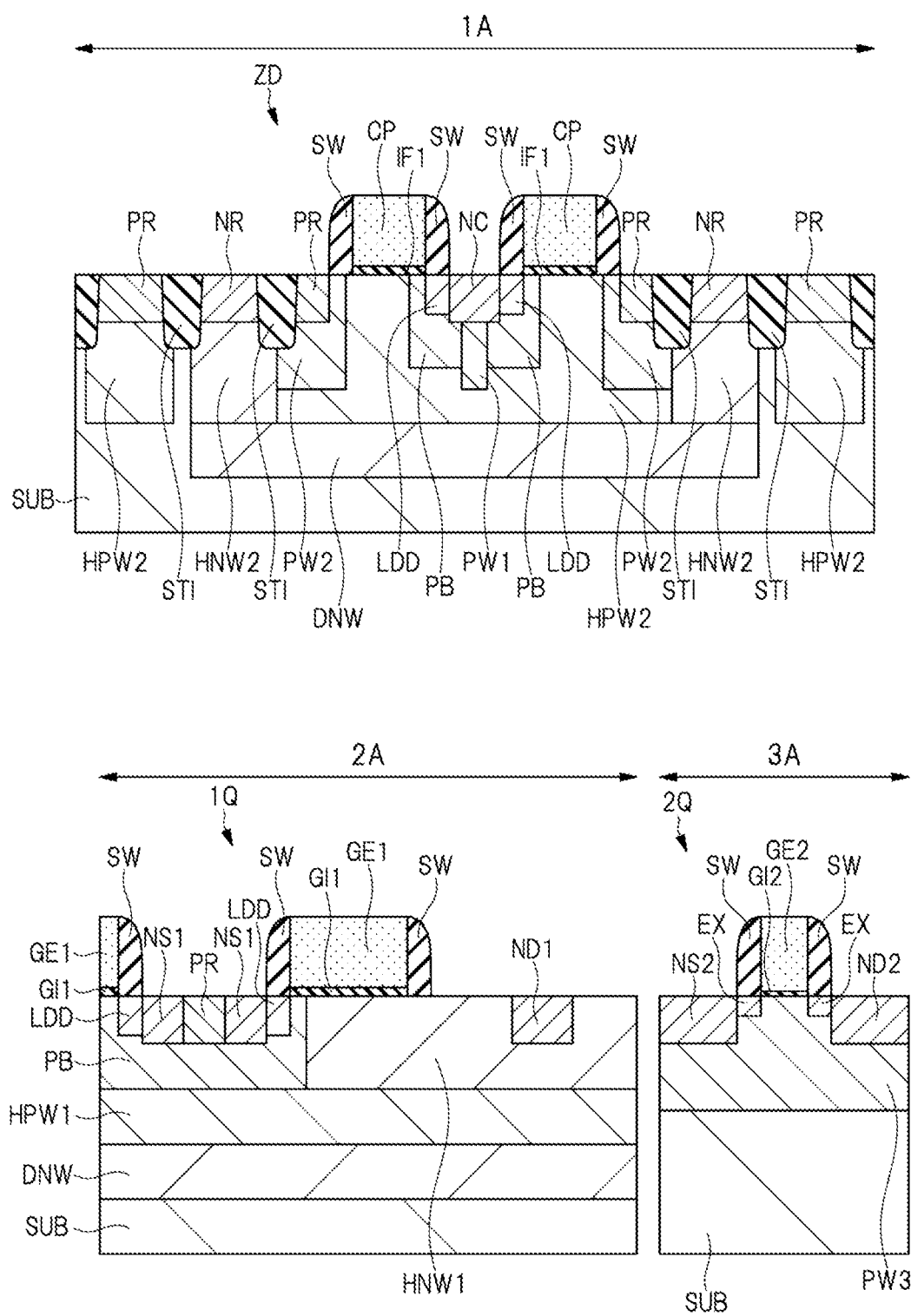
FIG. 17 is a cross-sectional view showing a manufacturing step of the semiconductor device following FIG. 16.

As shown in FIG. 17, by a photolithography technique and an ion-implantation method, the n-type cathode region NC is formed in the body region PB in the region 1A, the n-type high concentration diffusion region NR is formed in the well region HNW2 in the region 1A, the n-type source region NS1 is formed in the body region PB in the region 2A, the n-type drain region ND1 is formed in the well region HNW1 in the region 2A, and the n-type source region NS2 and the n-type drain region ND2 are formed in the well region PW3 in the region 3A. The cathode region NC is formed in the well region HPW2 so as to be adjacent to the side surface SS1.

The ion-implantation for forming these regions is performed using, for example, arsenic (As) and phosphorus (P) as impurities, and is performed in a condition in which the implantation energy of the impurities is, for example, 10 keV or more and 30 keV or less, and the dose amount of the impurities is, for example, $1.0 \times 10^{15}/cm^2$ or more and $5.0 \times 10^{15}/cm^2$ or less. Note that the cathode region NC, the high concentration diffusion region NR, the source region NS1, the drain region ND1, the source region NS2, and the drain region ND2 may be formed by a plurality of times of ion-implantation with different implantation energies.

Next, the p-type high concentration diffusion region PR is formed in the well region PW2 and the well region HPW2 in the region 1A and the p-type high concentration diffusion region PR is formed in the body region PB in the region 2A, by a photolithography technique and an ion-implantation method.

The ion-implantation for forming these regions is performed using, for example, boron (B) as impurities, and is performed in a condition in which the implantation energy of the impurities is, for example, 1 keV or more and 20 keV or less, and the dose amount of impurities is, for example, $1.0 \times 10^{13}/cm^2$ or more and $5.0 \times 10^{15}/cm^2$ or less. It should be noted that the high concentration diffusion region PR may be formed by a plurality of times of ion-implantation with different implantation energies within the above-described conditions.

Through the above manufacturing steps, the Zener diode ZD is formed in the region 1A, the high withstand voltage MISFET 1Q is formed in the region 2A, and the low withstand voltage MISFET 2Q is formed in the region 3A.

Thereafter, the structure shown in FIG. 2 is obtained by performing the following manufacturing steps. First, the dielectric film IF2 made of, for example, a silicon oxide film is formed on the semiconductor substrate SUB by, for example, a CVD method so as to cover the Zener diode ZD, the high withstand voltage MISFET 1Q, and the low withstand voltage MISFET 2Q. Next, the dielectric film IF2 is selectively patterned by a photolithography technique and an anisotropic etching process so as to cover a portion of the gate electrode GE1, the sidewall spacers SW, and the well region HNW1.

Next, the silicide films SI are formed in regions exposed from the dielectric film IF2 and the sidewall spacers SW by using a conventional salicide technique. That is, the silicide films SI is formed on the conductive pattern CP, the cathode region NC, the high concentration diffusion region PR, the high concentration diffusion region NR, the gate electrode GE1, the drain region ND1, the source region NS1, the gate electrode GE2, the drain region ND2, and the source region NS2.

As described above, in the first embodiment, the Zener diode ZD can be formed by using a manufacturing step for forming the high withstand voltage MISFET 1Q in the region 2A and the low withstand voltage MISFET 2Q in the region 3A. Therefore, since there is no need to add an implantation step to form the well region PW1 of the Zener diode ZD, the manufacturing cost of the semiconductor device can be suppressed.

Second Embodiment

The semiconductor device in the second embodiment will be described below with reference to FIG. 18. Note that, in the following description, differences from the first embodiment will be mainly described, and the description of overlapping points with the first embodiment will be omitted.

In the second embodiment, the well region PW1 located under the cathode region NC in the region 1A is formed deeper than the well region PW1 in the first embodiment.

Figure 18:
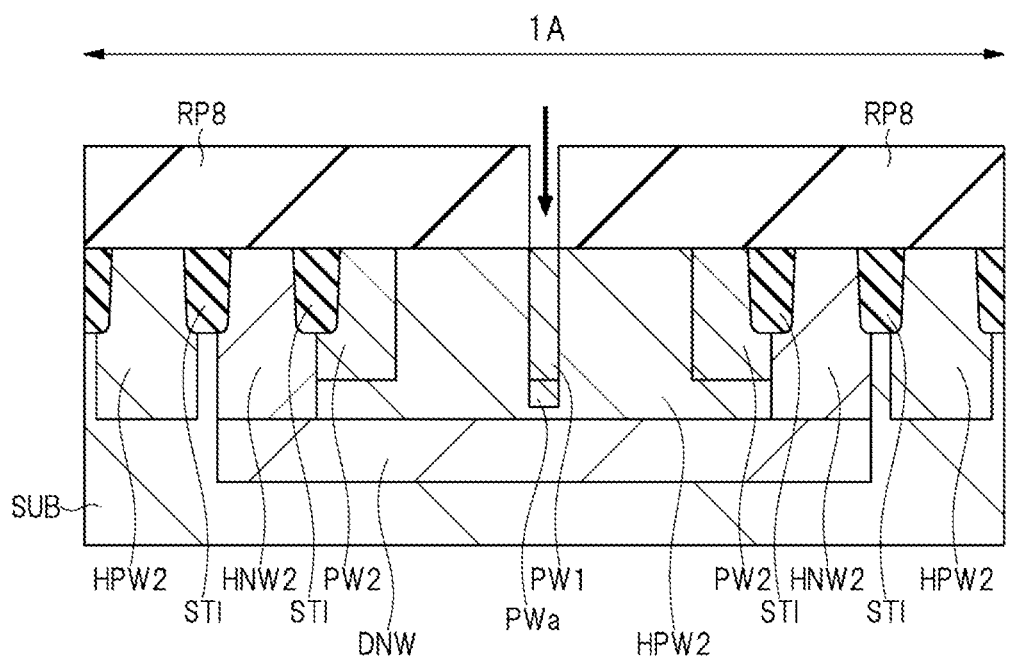
FIG. 18 is a cross-sectional view showing a manufacturing step of a semiconductor device in a second embodiment.
Figure 18:
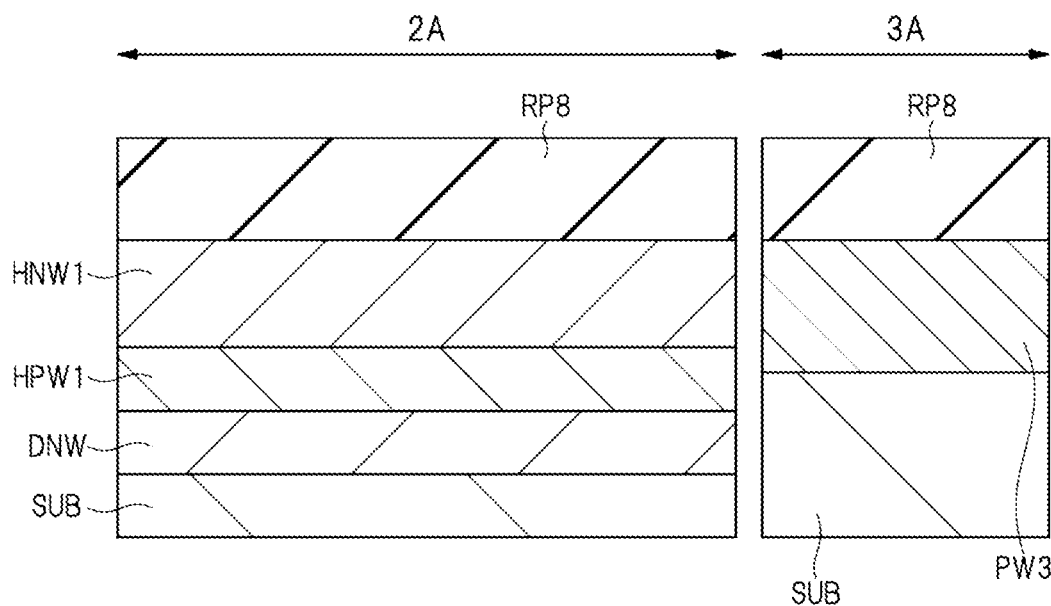

FIG. 18 shows a manufacturing step performed between FIG. 9 and FIG. 10. In FIG. 18, first, the resist pattern RP8 is formed on the semiconductor substrate SUB in the region 2A and the region 3A so as to selectively open the well region PW1 connected to the cathode region NC in the region 1A. Next, by performing an ion-implantation using the resist pattern RP8 as a mask, the well region PWa is formed under the well region PW1. The well region PWa is integrated with the well region PW1 and becomes a portion of the well region PW1.

The ion-implantation for forming the well region PWa is performed using, for example, boron (B) as impurities, and is performed in a condition in which the dose amount of the impurities is, for example, $1.0 \times 10^{12}/cm^2$ or more and $5.0 \times 10^{13}/cm^2$ or less. The implantation energy of the ion-implantation for forming the well region PWa is higher than the implantation energy of the ion-implantation for forming the well region PW1, and the ion-implantation for forming the well region PWa is performed in a condition that the implantation energy of the impurities is, for example, 150 keV or more and 180 keV or less.

According to the second embodiment, the high concentration well region PW1 can be more reliably formed deeper than the body region PB. That is, the well region PW1 can be formed such that the bottom surface of the well region PW1 is located deeper than the bottom surface of the body region PB. Since the resistive components under the cathode region NC are reduced, the path of the main current flowing through the Zener diode ZD is likely to be the path from the cathode region NC to the well region PW1. Therefore, it is easy to further suppress the fluctuation of the breakdown voltage caused by the hot carrier such as the examined example, so that the reliability of the semiconductor device can be further improved.

Third Embodiment

The semiconductor device in the third embodiment will be described below with reference to FIGS. 19 and 20. Note that, in the following description, differences from the first embodiment will be mainly described, and the description of overlapping points with the first embodiment will be omitted.

In the first embodiment, as shown in FIG. 4, the conductive pattern CP is in an electrically floating state.

Figure 19:
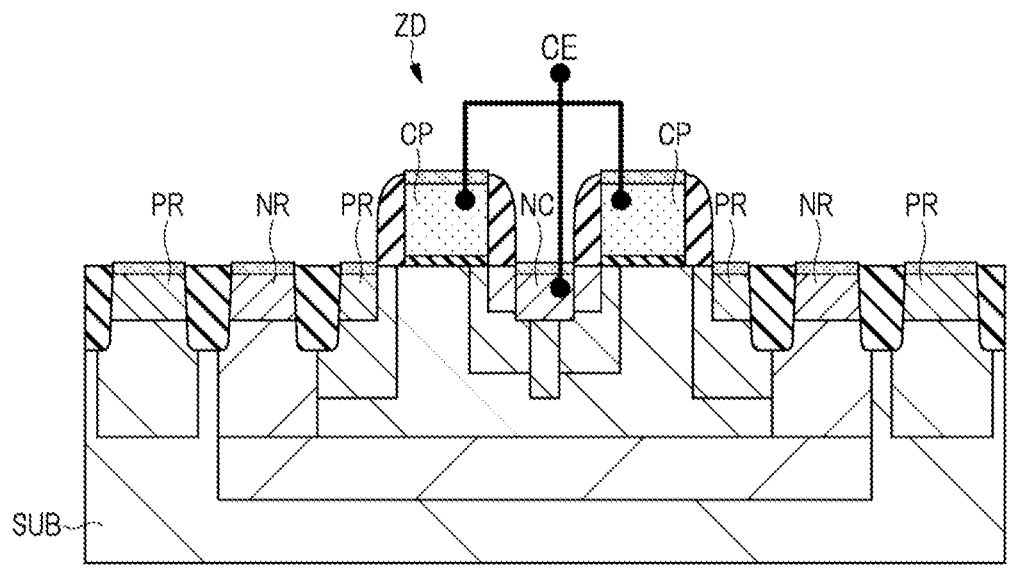
FIG. 19 is a cross-sectional view showing a semiconductor device in a third embodiment.

In the third embodiment, as shown in FIG. 19, the conductive pattern CP is electrically connected to the cathode electrode CE. When a positive potential is applied to the conductive pattern CP, the region under the conductive pattern CP is depleted, the electric field at the end portion of the conductive pattern CP is relaxed, and the fluctuation of the breakdown voltage can be suppressed.

Figure 20:
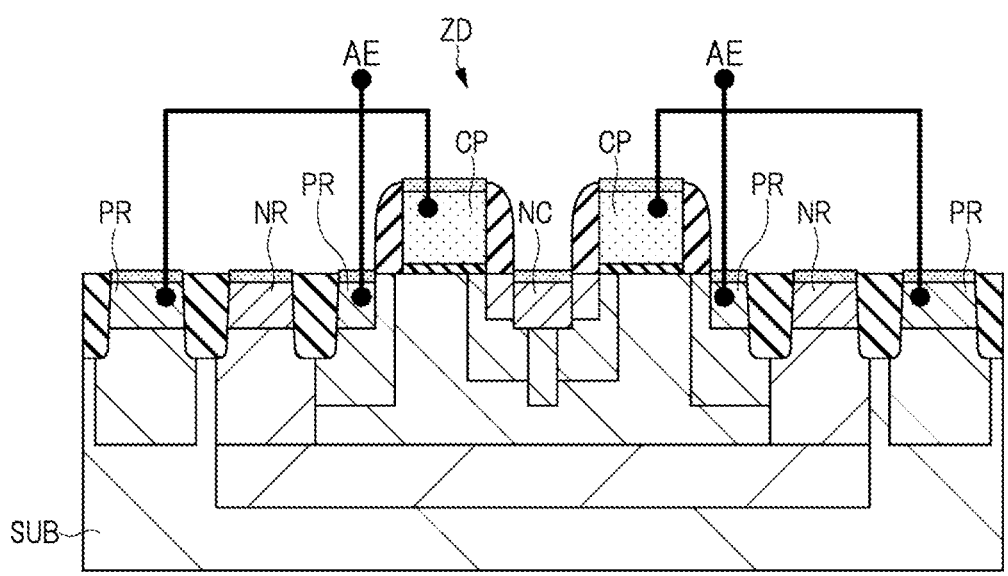
FIG. 20 is a cross-sectional view showing a semiconductor device in a third embodiment.

Further, as shown in FIG. 20, the conductive pattern CP may be electrically connected to the anode electrode AE or the semiconductor substrate SUB. Even in this case, fluctuations in the breakdown voltage can be suppressed.

The technique described in the third embodiment can be combined with the technique of the second embodiment.

Fourth Embodiment

The semiconductor device in the fourth embodiment will be described below with reference to FIGS. 21 and 22. Note that, in the following description, differences from the first embodiment will be mainly described, and the description of overlapping points with the first embodiment will be omitted.

In the first embodiment, the silicide film SI is formed on almost the entire upper surface of the cathode region NC. In the fourth embodiment, the planar area of the silicide film SI formed on the cathode region NC is smaller than the planar area of the silicide film SI formed on the cathode region NC in the first embodiment.

Figure 21:
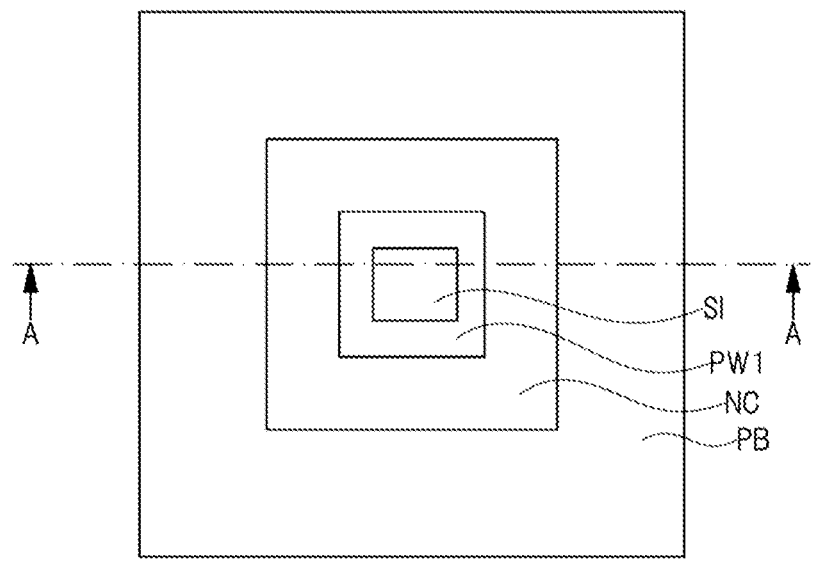
FIG. 21 is a main portion plan view showing a semiconductor device in a fourth embodiment.

FIG. 21 is a plan view showing the perimeter of the cathode region NC. FIG. 22 is a cross-sectional view along line A-A shown in FIG. 21.

Figure 22:
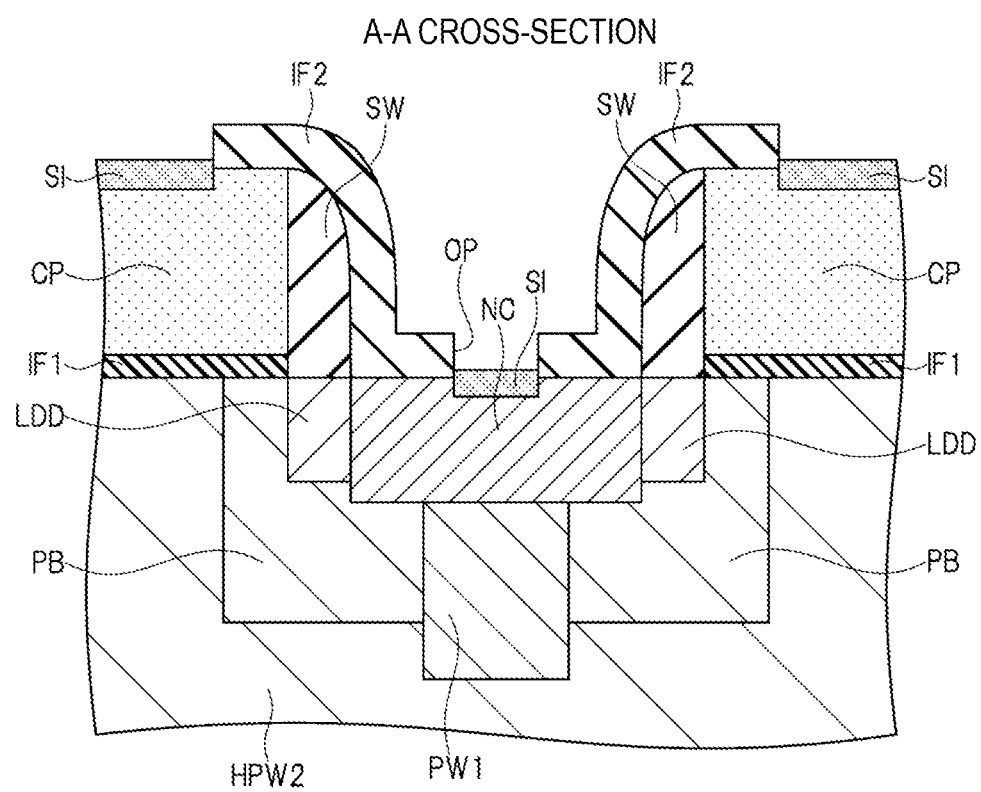
FIG. 22 is a cross-sectional view showing the semiconductor device in the fourth embodiment.

As shown in FIG. 22, the dielectric film IF2 that is selectively left in the region 2A is also left in the region 1A. That is, prior to forming the silicide films SI, the dielectric film IF2 is formed so as to cover a portion of the conductive pattern CP, a portion of the sidewall spacers SW, and a portion of the cathode region NC in the region 1A. The opening portion OP is provided in the dielectric film IF2, and the silicide film SI is formed on the cathode region NC exposed from the opening portion OP. Therefore, the planar area of the silicide film SI is smaller than the planar area of the silicide film SI in the first embodiment.

As shown in FIG. 21, in the fourth embodiment, the silicide film SI is included in the cathode region NC and the well region PW1 in plan view. Therefore, the cathode electrode CE formed on the silicide film SI is disposed at the center of the cathode region NC. Since the electric field is concentrated in the central portion of the cathode region NC, the concentration of the electric field on the side surface of the cathode region NC is further reduced. Therefore, the resistance to hot carriers is further improved, so that the fluctuation of the breakdown voltage can be further suppressed.

The technique described in the fourth embodiment can be combined with the techniques of the second embodiment and the third embodiment.

Although the present invention has been described in detail based on the above-described embodiments, the present invention is not limited to the above-described embodiments, and can be various modified without departing from the gist thereof.

What is claimed is:
1. A method of manufacturing a semiconductor device including a first region where a Zener diode is formed, the method comprising:
    (a) forming a first impurity region of a first conductivity type in a semiconductor substrate in the first region;
    (b) after the (a), forming a second impurity region of the first conductivity type in the first impurity region;
    (c) after the (b), forming a third impurity region of the first conductivity type in the first impurity region; and
    (d) after the (c), forming a fourth impurity region of a second conductivity type opposite the first conductivity type in the third impurity region,
    wherein the method comprises:
        (e) between the (b) and the (c), forming a first dielectric film on the semiconductor substrate;
        (f) between the (e) and the (c), forming a first conductive film on the first dielectric film;
        (g) between the (f) and the (c), selectively patterning the first conductive film in the first region to form a first side surface of a first conductive pattern formed of the first conductive film in the first region;
        (h) between the (c) and the (d), selectively patterning the first conductive film in the first region to form the first conductive pattern, the first conductive pattern having a second side surface opposite the first side surface; and
        (i) between the (h) and the (d), forming a first sidewall spacer on each of the first side surface and the second side surface,
    wherein an impurity concentration of the third impurity region is higher than an impurity concentration of the first impurity region,
    wherein an impurity concentration of the second impurity region is higher than the impurity concentration of the third impurity region,
    wherein the third impurity region includes the fourth impurity region in plan view,
    wherein the fourth impurity region includes the second impurity region in plan view,
    wherein the third impurity region and the fourth impurity region are formed in the first impurity region so as to be adjacent to the first side surface,
    wherein in the (c), a portion of the third impurity region is formed in the first impurity region so as to overlap the first conductive pattern in plan view by an oblique ion implantation,
    wherein the fourth impurity region configures a cathode of the Zener diode, and
    wherein the first impurity region, the second impurity region and the third impurity region configure an anode of the Zener diode.
2. The method according to claim 1, comprising:
    (j) between the (g) and the (h), forming a fifth impurity region of the first conductivity type in the first impurity region so as to be adjacent to the first side surface,
    wherein an impurity concentration of the fifth impurity region is lower than an impurity concentration of the fourth impurity region,
    wherein the third impurity region includes the fifth impurity region in plan view, and
    wherein the fifth impurity region includes the fourth impurity region in plan view.
3. The method according to claim 1,
    wherein in the (b), the second impurity region is formed by multiple ion implantations with different implant energies.
4. The method according to claim 3,
    wherein the second impurity region is formed deeper than the third impurity region.
5. The method according to claim 1, comprising:
    (k) after the (d), forming a silicide film on the fourth impurity region exposed from the sidewall spacer.
6. The method according to claim 1, comprising:
    (l) after the (d), forming a second dielectric film on the fourth impurity region;
    (m) after the (l), forming an opening portion in the second dielectric film so as to expose a portion of the fourth impurity region; and
    (n) after the (m), forming a silicide film on the fourth impurity region exposed in the opening portion.
7. The method according to claim 1,
    wherein the semiconductor device includes a second region where a first MISFET is formed,
    wherein the method comprises:
        (o) before the (e), forming an eighth impurity region of the second conductivity type in the semiconductor substrate in the second region,
    wherein in the (e), a first gate dielectric film is formed on the eighth impurity region,
    wherein in the (f), the first conductive film is formed on the first gate dielectric film,
    wherein in the (g), the first conductive film in the second region is selectively patterned to form a third side surface of a first gate electrode formed of the first conductive film in the second region, wherein in the (c), a ninth impurity region of the first conductivity type is formed in the eighth impurity region adjacent to the third side surface and in the eighth impurity region under the first conductive film by an oblique ion implantation, wherein in the (h), the first conductive film in the second region is selectively patterned to form the first gate electrode having the third side surface and a fourth side surface opposite the third side surface, wherein in the (i), forming a second sidewall spacer on each of the third side surface and the fourth side surface, wherein in the (d), a first source region of the second conductivity type is formed in the ninth impurity region and a first drain region of the second conductivity type is formed in the eighth impurity region, and wherein an impurity concentration of each of the first source region and the first drain region is higher than an impurity concentration of the eighth impurity region.

8. The method according to claim 7, wherein the semiconductor device includes a third region where a second MISFET is formed, wherein in the (b), a tenth impurity region of the first conductivity type is formed in the semiconductor substrate in the third region, wherein between the (e) and the (f), a second gate dielectric film having a thickness smaller than a thickness of each of the first dielectric film and the first gate dielectric film is formed on the tenth impurity region, wherein in the (f), the first conductive film is formed on the second gate dielectric film, wherein in the (h), the first conductive film in the third region is selectively patterned to form a second gate electrode, wherein in the (i), a third sidewall spacer is formed on each of both side surfaces of the second gate electrode, and wherein in the (d), a second source region of the second conductivity type and a second drain region of the second conductivity type are formed in the tenth impurity region.

* * * * *